United States Patent
Kobayashi et al.

(10) Patent No.: US 11,076,116 B2
(45) Date of Patent: Jul. 27, 2021

(54) IMAGING DEVICE AND CAMERA SYSTEM THAT CONTROLS A PERIOD IN WHICH THE CLOCK SIGNAL IS SUPPLIED TO THE COUNTER IN THE COUNTING PERIOD OF A SECOND PIXEL BASED ON A SIGNAL LEVEL OF A FIRST PIXEL

(71) Applicant: PANASONIC INTELLECTUAL PROPERTY MANAGEMENT CO., LTD., Osaka (JP)

(72) Inventors: Tsutomu Kobayashi, Osaka (JP); Yuusuke Shimizu, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/852,109

(22) Filed: Apr. 17, 2020

(65) Prior Publication Data

US 2020/0244905 A1 Jul. 30, 2020

Related U.S. Application Data

(63) Continuation of application No. 15/991,765, filed on May 29, 2018, now Pat. No. 10,666,887.

(30) Foreign Application Priority Data

Jun. 9, 2017 (JP) .............................. JP2017-114217

(51) Int. Cl.
*H04N 5/335* (2011.01)
*H04N 5/374* (2011.01)
(Continued)

(52) U.S. Cl.
CPC ....... *H04N 5/374* (2013.01); *H01L 27/14603* (2013.01); *H01L 27/14643* (2013.01);
(Continued)

(58) Field of Classification Search
CPC ............................................... H04N 5/232411
See application file for complete search history.

(56) References Cited

U.S. PATENT DOCUMENTS

2017/0048475 A1 2/2017 Sakuragi

FOREIGN PATENT DOCUMENTS

JP 2002-300477 A 10/2002
JP 2009-206709 A 9/2009
(Continued)

OTHER PUBLICATIONS

Notice of Allowance issued in U.S. Appl. No. 15/991,765, dated Jan. 17, 2020.

*Primary Examiner* — Gary C Vieaux
(74) *Attorney, Agent, or Firm* — McDermott Will and Emery LLP

(57) ABSTRACT

An imaging device includes: pixels arranged in m rows by n columns; a first comparator that generates a first output signal indicating a result of comparison between a first pixel signal outputted from each pixel located in an $a^{th}$ column among the pixels and a reference signal; a first counter that generates a first digital signal by counting a period from start of a first counting period to inversion of the first output signal; and a first control circuit that determines, in accordance with a magnitude correlation between the first digital signal obtained from a first pixel located at the $a^{th}$ column and a $b^{th}$ row and a threshold, a period in which the first clock signal is supplied to the first counter in the first counting period of a second pixel located at the $a^{th}$ column and a $c^{th}$ row different from the $b^{th}$ row.

15 Claims, 37 Drawing Sheets

(51) Int. Cl.
*H01L 27/146* (2006.01)
*H04N 5/232* (2006.01)
*H04N 5/369* (2011.01)
*H04N 5/378* (2011.01)
*H04N 5/357* (2011.01)
*H04N 5/353* (2011.01)

(52) U.S. Cl.
CPC ..... *H04N 5/23229* (2013.01); *H04N 5/23245* (2013.01); *H04N 5/232411* (2018.08); *H04N 5/353* (2013.01); *H04N 5/3577* (2013.01); *H04N 5/378* (2013.01); *H04N 5/379* (2018.08)

(56) References Cited

FOREIGN PATENT DOCUMENTS

| JP | 2010-232747 | A | 10/2010 |
|----|-------------|---|---------|
| JP | 2017-038315 | A | 2/2017  |
| JP | 2017-098890 | A | 6/2017  |

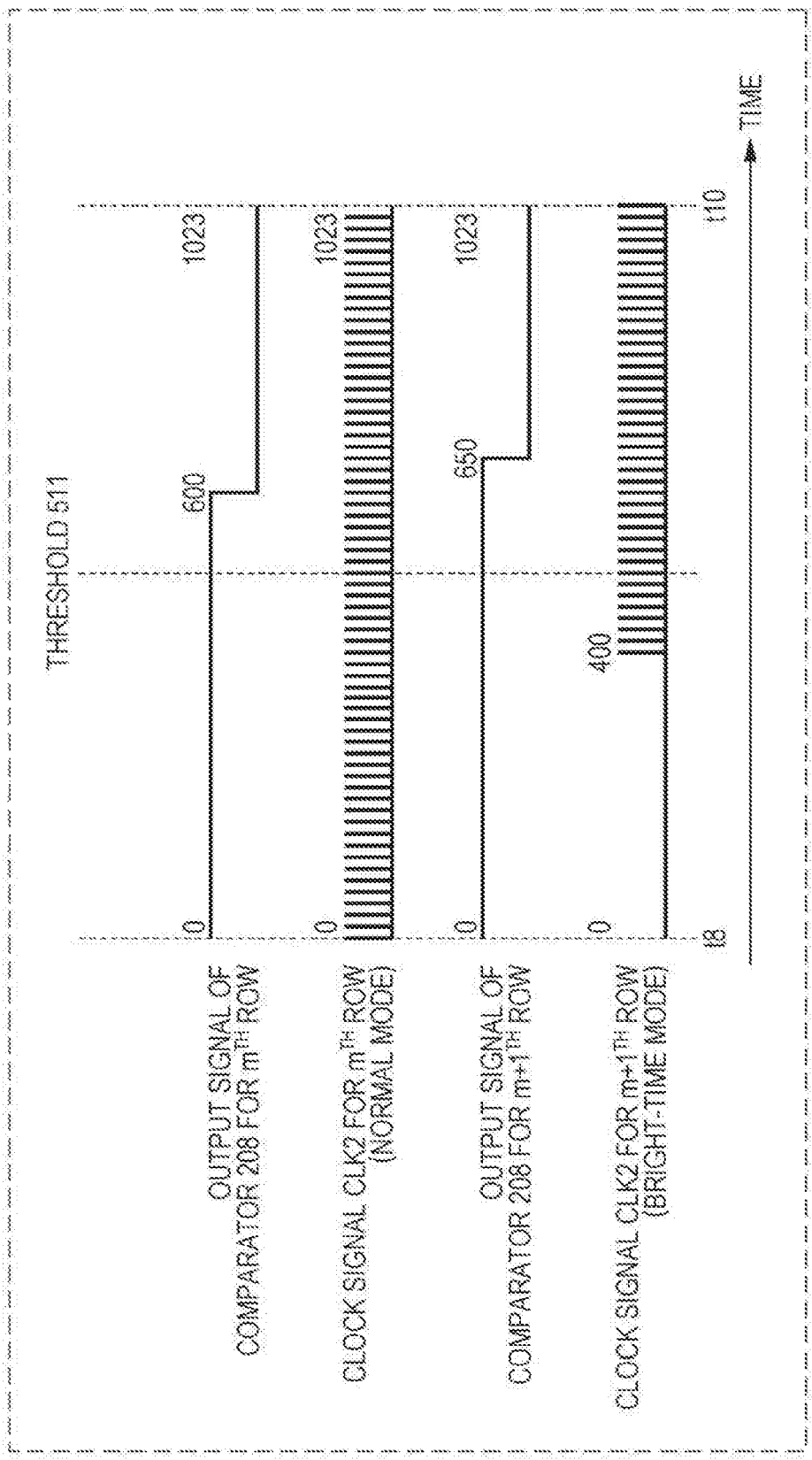

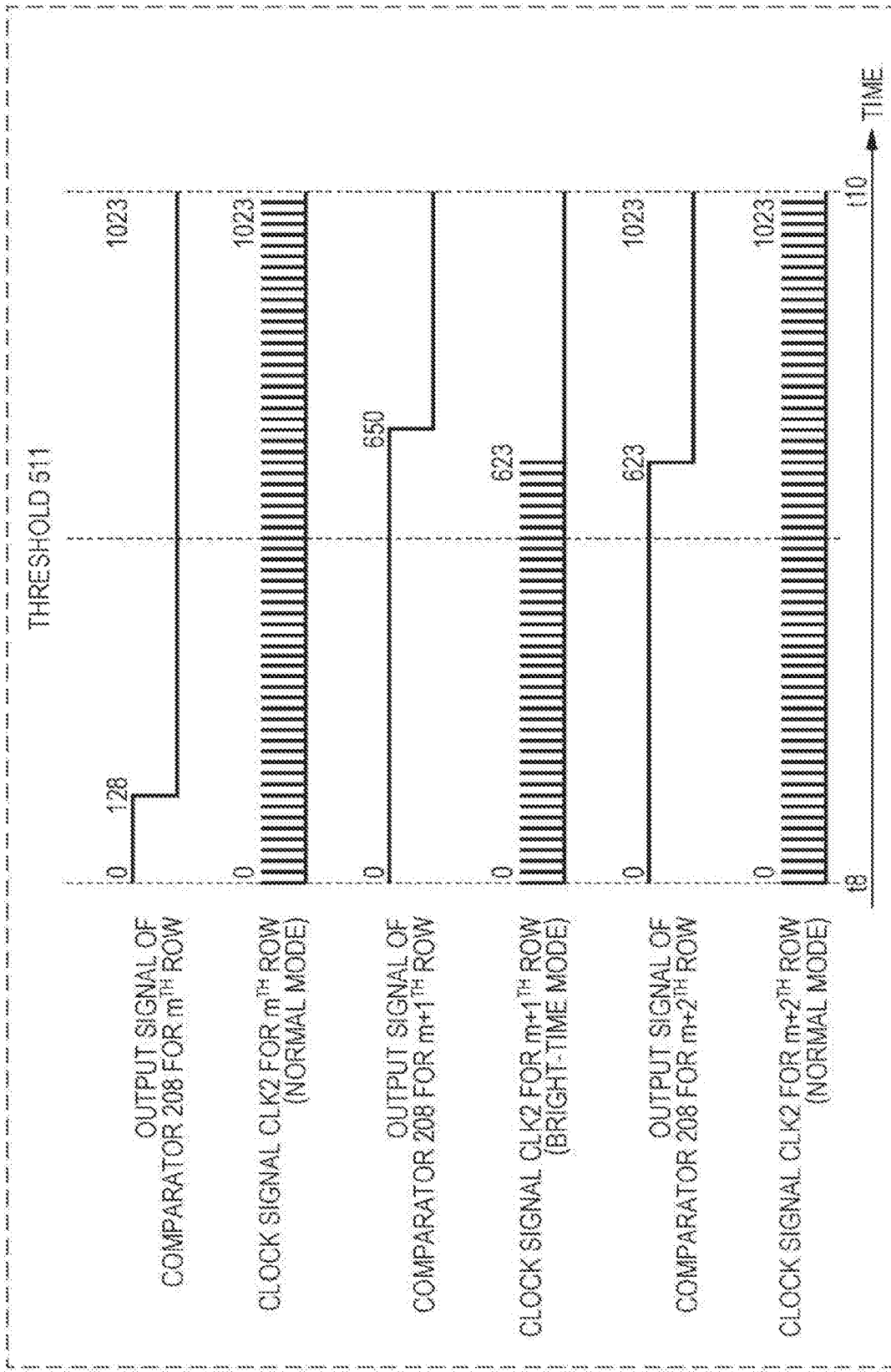

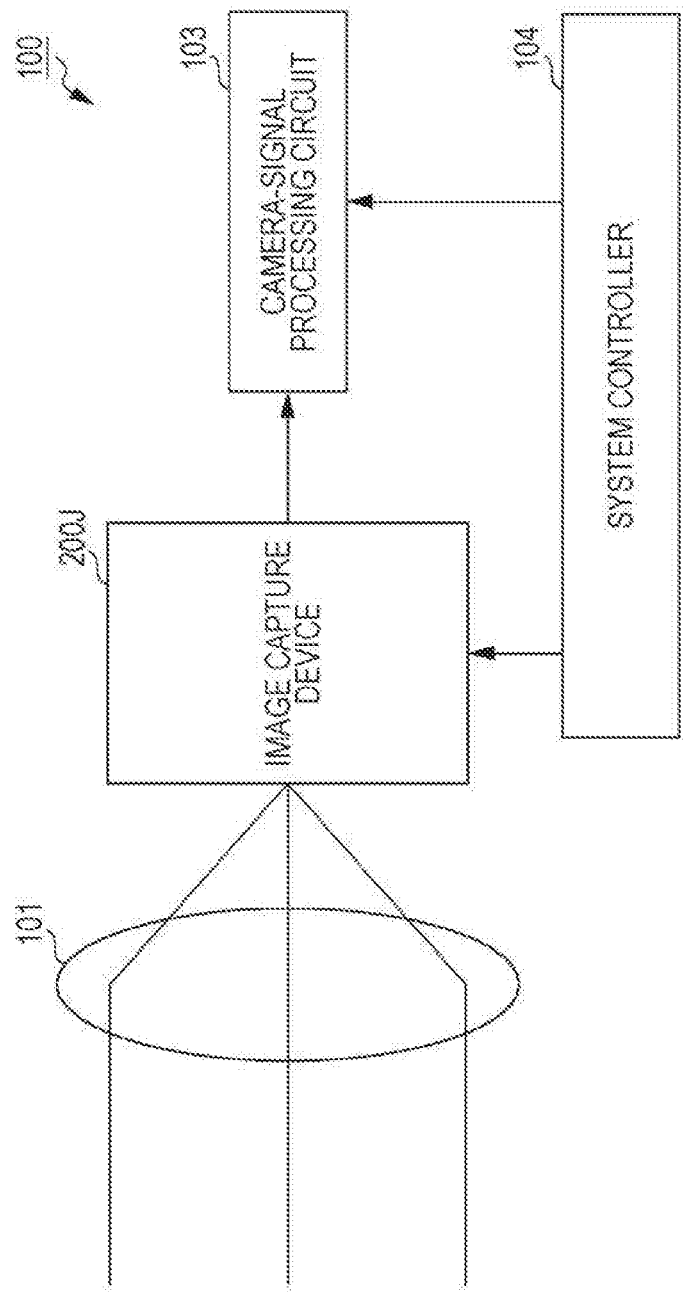

IMAGING DEVICE AND CAMERA SYSTEM THAT CONTROLS A PERIOD IN WHICH THE CLOCK SIGNAL IS SUPPLIED TO THE COUNTER IN THE COUNTING PERIOD OF A SECOND PIXEL BASED ON A SIGNAL LEVEL OF A FIRST PIXEL

CROSS-REFERENCE OF RELATED APPLICATIONS

This application is a Continuation of U.S. patent application Ser. No. 15/991,765, filed on May 29, 2018, which claims the benefit of Japanese Application No. 2017-114217, filed on Jun. 9, 2017, the entire disclosures of which Applications are incorporated by reference herein.

BACKGROUND

1. Technical Field

The present disclosure relates to imaging devices and camera systems.

2. Description of the Related Art

Solid-state imaging devices for converting light into electrical signals have been used in various appliances, such as smartphones, cameras for monitors, on-board cameras, medical cameras, digital video cameras, and digital still cameras. Charge-coupled device (CCD) image sensors and complementary metal-oxide semiconductor (CMOS) image sensors have been known as solid-state imaging devices.

Each CMOS image sensor performs analog-to-digital (A/D) conversion on electrical signals read from a plurality of pixels arranged in a matrix and outputs the resulting digital signals.

Also, a solid-state imaging device that includes A/D conversion circuits for respective columns and that outputs digital signals resulting from A/D conversion for each row has been known as a CMOS image sensor (see, e.g., Japanese Unexamined Patent Application Publication No. 2009-206709).

SUMMARY

In such imaging devices, there are demands for reducing power consumption.

In one general aspect, the techniques disclosed here feature an imaging device including: pixels arranged in m rows by n columns, where each of m and n is an integer greater than or equal to 2, each of the pixels generating a pixel signal in accordance with incident light; a first signal line, through which a first pixel signal outputted from each of pixels in an $a^{th}$ column among the pixels is transmitted, where a is an integer of 1 to n; a first load-current circuit that supplies a first load current to the first signal line; a first control circuit; a first conversion circuit that converts the first pixel signal into a first digital signal; and a comparison circuit that compares the first digital signal with a threshold. The first conversion circuit includes a first comparator that compares the first pixel signal with a reference signal, to generate a first output signal indicating a result of comparison, and a first counter that counts a period from start of a first counting period to inversion of the first output signal by using a first clock signal, to generate the first digital signal. In accordance with a magnitude correlation between the first digital signal obtained from a first pixel located at the $a^{th}$ column and a $b^{th}$ row and the threshold, the first control circuit determines a period in which the first clock signal is supplied to the first counter in the first counting period of a second pixel located at the $a^{th}$ column and a $c^{th}$ row different from the $b^{th}$ row, where each of b and c is an integer of 1 to m.

It should be noted that general or specific embodiments may be implemented as a system, a method, an integrated circuit, a computer program, a computer-readable storage medium such as a compact disc read-only memory (CD-ROM), or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 7 is a timing chart illustrating an example operation of the counter in an up-counting period during the bright-time mode in the imaging device in the first embodiment;

FIG. 8 is a timing chart illustrating an example operation of the counter in the up-counting period of the imaging device in the first embodiment;

FIG. 37 is a block diagram illustrating an example configuration of a camera system according to a fifth embodiment.

Figure 1:
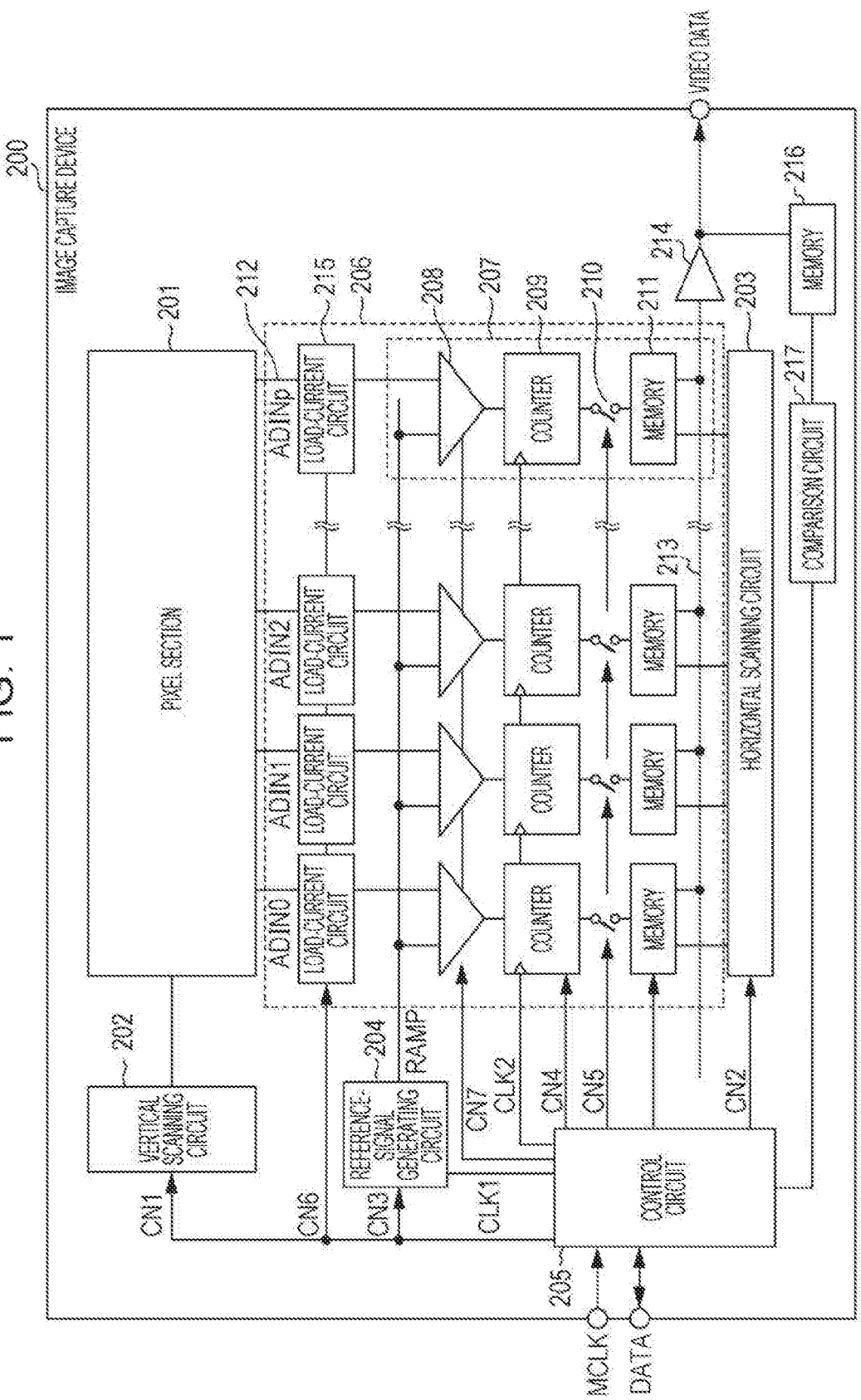
FIG. 1 is a block diagram illustrating an exemplary circuit configuration of an imaging device in a first embodiment.

DETAILED DESCRIPTION (Knowledge that LED to Present Disclosure)

Recent years have seen increasing demands for higher frame rates and higher resolutions in imaging devices. An increase in the number of rows which is involved in an increase in the number of pixels influences power consumption, and an increase in the resolution causes an increase in the number of bits in A/D conversion. Owing to the influence on the power consumption or in conjunction with the increase in the number of bits, the amount of processing in A/D conversion processing increases. This causes a problem that the power consumption increases.

In particular, column A/D circuits are arranged for respective columns in a pixel array. Accordingly, the power consumed by the column A/D circuits increasingly influences the power consumed by the entire imaging devices when the number of columns increases. Also, when a counter clock is delayed in order to reduce the power consumption, the period of A/D conversion increases, thus causing a problem that the frame rate decreases.

Meanwhile, an increase in the number of pixels or an increase in the dynamic range owing to implementation of two cells per pixel leads to an increase in the range of a voltage in vertical signal lines. As a result, bias currents that flow to load-current circuits increase, thereby also causing a problem that the power consumption increases.

An increase in the power consumed by the imaging device causes heat production. An increase in the temperature increases shading or noise, such as dark current, thereby reducing the image quality. Amid improvement in requested capabilities, such as increases in the frame rate, the number of pixels, and the dynamic range, how to reduce the power consumed by the imaging device has becomes important.

In general, power for smartphones, digital still cameras, and digital video cameras are supplied from batteries. Hence, in order to realize long-time photography with such appliances, it is desired to reduce the power consumed by imaging devices provided in the appliances.

In the present disclosure, a description will be given of imaging devices and a camera system that can reduced power consumption.

An imaging device according to one aspect of the present disclosure includes: pixels arranged in m rows by n columns, where each of m and n is an integer greater than or equal to 2, each of the pixels generating a pixel signal in accordance with incident light; a first signal line, through which a first pixel signal outputted from each of pixels in an $a^{th}$ column among the pixels is transmitted, where a is an integer of 1 to n; a first load-current circuit that supplies a first load current to the first signal line; a first control circuit; a first conversion circuit that converts the first pixel signal into a first digital signal; and a comparison circuit that compares the first digital signal with a threshold. The first conversion circuit includes a first comparator that compares the first pixel signal with a reference signal, to generate a first output signal indicating a result of comparison, and a first counter that counts a period from start of a first counting period to inversion of the first output signal by using a first clock signal, to generate the first digital signal. In accordance with a magnitude correlation between the first digital signal obtained from a first pixel located at the $a^{th}$ column and a $b^{th}$ row and the threshold, the first control circuit controls an operation current of the first comparator in the first counting period of a second pixel located at the $a^{th}$ column and a $c^{th}$ row different from the $b^{th}$ row, where each of b and c is an integer of 1 to m.

Thus, in this imaging device, the operation current of the first comparator in the first counting period of the second pixel can be controlled in accordance with a signal level of the first pixel. Thus, for example, since the operation current of the first comparator can be reduced in a partial period in accordance with brightness, the imaging device can reduce the power consumption.

For example, in accordance with the magnitude correlation between the first digital signal obtained from the first pixel and the threshold, the first control circuit may determine a period that is included in the first counting period of the second pixel and in which the first comparator operates.

Thus, for example, since the first comparator can be caused to operate in a partial period in accordance with brightness and can be caused to stop operating in another period, the imaging device can reduce the power consumption.

For example, the imaging device may further include: a second signal line, through which a second pixel signal outputted from each of pixels in a $d^{th}$ column different from the $a^{th}$ column among the pixels is transmitted, where d is an integer of 1 to n; a second load-current circuit that supplies a second load current to the second signal line; and a second conversion circuit that converts the second pixel signal into a second digital signal. The comparison circuit may compare the second digital signal with the threshold. The second conversion circuit may include a second comparator that compares the second pixel signal with the reference signal, to generate a second output signal indicating a result of comparison, and a second counter that counts a period from start of a second counting period to inversion of the second output signal by using a second clock signal, to generate the second digital signal. In accordance with a magnitude correlation between the second digital signal obtained from a third pixel at the $d^{th}$ column and an $e^{th}$ row and the threshold, the first control circuit may control an operation current of the second comparator in the second counting period of a fourth pixel located at the $d^{th}$ column and an $f^{th}$ row different from the $e^{th}$ row, where each of e and f is an integer of 1 to m.

Thus, in this imaging device, since the operation current of the first comparator and the operation current of the second comparator can be individually controlled, the operation currents of the comparators can be appropriately controlled in accordance with brightness in each image region.

For example, the imaging device may further include: a second signal line, through which a second pixel signal outputted from each of the pixels in a $d^{th}$ column different from the $a^{th}$ column among the pixels is transmitted, where d is an integer of 1 to n; a second load-current circuit that supplies a second load current to the second signal line; a second control circuit; and a second conversion circuit that converts the second pixel signal into a second digital signal. The comparison circuit may compare the second digital signal with the threshold. The second conversion circuit may include a second comparator that compares the second pixel signal with the reference signal, to generate a second output signal indicating a result of comparison, and a second counter that counts a period from start of a second counting period to inversion of the second output signal by using a second clock signal, to generate the second digital signal. In accordance with a magnitude correlation between the second digital signal obtained from a third pixel located at the $d^{th}$ column and an $e^{th}$ row and the threshold, the second control circuit may control an operation current of the second comparator in the second counting period of a fourth pixel located at the $d^{th}$ column and an $f^{th}$ row different from the $e^{th}$ row, where each of e and f is an integer of 1 to m. The first control circuit may be located outside a region in which the first load-current circuit and the second load-current circuit are located, the first control circuit being closer to a region in which the first load-current circuit is located. The second control circuit may be located outside the region in which the first load-current circuit and the second load-current circuit are located, the second control circuit being closer to a region in which the second load-current circuit is located.

Thus, in this imaging device, since the operation current of the first comparator and the operation current of the second comparator can be individually controlled, the operation currents of the comparators can be appropriately controlled in accordance with brightness in each image region. In addition, the size of a region in which wires through which control signals are transmitted are provided can be reduced, compared with a case in which control signals are transmitted from a single first control circuit to the first comparator and the second comparator. Also, since variations in the length of the wires through which the control signals are transmitted can be reduced, it is possible to reduce variations in the control signals supplied to the comparators.

For example, the threshold may include a first threshold and a second threshold greater than the first threshold. In accordance with a magnitude correlation between the first digital signal obtained from the first pixel and the first and second thresholds, the first control circuit may control an operation current of the first comparator in the first counting period of the second pixel.

Thus, in this imaging device, the operation currents of the comparators can be appropriately controlled through use of the plurality of thresholds.

For example, in accordance with the magnitude correlation between the first digital signal obtained from the first pixel and the threshold, the first control circuit may determine a period that is included in the first counting period of the second pixel and in which the first clock signal is supplied to the first counter.

Thus, in this imaging device, a period that is included in the first counting period of the second pixel and in which the first clock signal is supplied to the first counter can be determined in accordance with the signal level of the first pixel. Thus, in this imaging device, for example, since the first clock signal can be supplied to the first counter in a partial period in accordance with the brightness, and the supply of the first clock signal can be stopped in another period, it is possible to reduce the power consumption.

For example, the imaging device may further include: a second signal line, through which a second pixel signal outputted from each of the pixels in a $d^{th}$ column different from the $a^{th}$ column among the pixels is transmitted, where d is an integer of 1 to n; a second load-current circuit that supplies a second load current to the second signal line; and a second conversion circuit that converts the second pixel signal into a second digital signal. The comparison circuit may compare the second digital signal with the threshold. The second conversion circuit may include a second comparator that compares the second pixel signal with the reference signal, to generate a second output signal indicating a result of comparison, and a second counter that counts a period from start of a second counting period to inversion of the second output signal by using a second clock signal, to generate the second digital signal. In accordance with a magnitude correlation between the second digital signal obtained from a third pixel located at the $d^{th}$ column and an $e^{th}$ row and the threshold, the first control circuit may determine a period that is included in the second counting period of a fourth pixel located at the $d^{th}$ column and an $f^{th}$ row different from the $e^{th}$ row and in which the second clock signal is supplied to the second counter, where each of e and f is an integer of 1 to m.

Thus, in this imaging device, since the supply of the first clock signal and the supply of the second clock signal can be individually controlled, the supply of the clock signals can be appropriately controlled in accordance with the brightness in each image region.

For example, the imaging device may further include: a second signal line, through which a second pixel signal outputted from each of the pixels in a $d^{th}$ column different from the $a^{th}$ column among the pixels, where d is an integer of 1 to n; a second load-current circuit that supplies a second load current to the second signal line; a second control circuit; and a second conversion circuit that converts the second pixel signal into a second digital signal. The comparison circuit may compare the second digital signal with the threshold. The second conversion circuit may include a second comparator that compares the second pixel signal with the reference signal, to generate a second output signal indicating a result of comparison, and a second counter that counts a period from start of a second counting period to inversion of the second output signal by using a second clock signal, to generate the second digital signal. In accordance with a magnitude correlation between the second digital signal obtained from a third pixel located at the $d^{th}$ column and an $e^{th}$ row and the threshold, the second control circuit may determine a period that is included in the second counting period of a fourth pixel located at the $d^{th}$ column and an $f^{th}$ row different from the $e^{th}$ row and in which the second clock signal is supplied to the second counter, where each of e and f is an integer of 1 to m. The first control circuit may be located outside a region in which the first counter and the second counter are located, the first control circuit being closer to a region in which the first counter is located. The second control circuit may be located outside the region in which the first counter and the second counter are located, the second control circuit being closer to a region in which the second counter is located.

Thus, in this imaging device, since the supply of the first clock signal and the supply of the second clock signal can be individually controlled, the supply of the clock signals can be appropriately controlled in accordance with the brightness in each image region. In addition, the size of the region in which wires through which the clock signals are transmitted can be reduced, compared with a case in which the first clock signal and the second clock signal are supplied from a single first control circuit to the first counter and the second counter. Also, since variations in the length of wires through which the first clock signal and the second clock signal are transmitted can be reduced, it is possible to reduce variations in the clock signals supplied to the counters.

For example, the threshold may include a first threshold and a second threshold greater than the first threshold. In accordance with a magnitude correlation between the first digital signal obtained from the first pixel and the first and second thresholds, the first control circuit may determine a period that is included in the first counting period of the second pixel and in which the first clock signal is supplied to the first counter.

Thus, in this imaging device, the supply of the clock signals can be appropriately controlled through use of the plurality of thresholds. For example, in accordance with the magnitude correlation between the first digital signal obtained from the first pixel and the threshold, the first control circuit may determine a current value of the first load current supplied to the first signal line when the first pixel signal of the second pixel is transmitted.

Thus, in this imaging device, a load current when a signal of the second pixel is transmitted can be determined in accordance with the signal level of the first pixel. Thus, for example, since the load current when the brightness is low can be reduced, the imaging device can reduce the power consumption.

For example, the first control circuit may determine, as a first current value, the first load current supplied to the first signal line when the first pixel signal of the second pixel is transmitted, in a case where the first digital signal obtained from the first pixel is greater than the threshold, and may determine, as a second current value smaller than the first current value, the first load current supplied to the first signal line when the first pixel signal of the second pixel is transmitted, in a case where the first digital signal obtained from the first pixel is smaller than or equal to the threshold.

Thus, in this imaging device, since the load current when the brightness is low can be reduced, the power consumption can be reduced.

For example, the imaging device may further include: a second signal line, through which a second pixel signal outputted from each of the pixels in a $d^{th}$ column different from the $a^{th}$ column among the pixels is transmitted, where d is an integer of 1 to n; a second load-current circuit that supplies a second load current to the second signal line; and a second conversion circuit that converts the second pixel signal into a second digital signal. The comparison circuit may compare the second digital signal with the threshold. In accordance with a magnitude correlation between the second digital signal obtained from a third pixel located at the $d^{th}$ column and an $e^{th}$ row and the threshold, the first control circuit may determine a current value of the second load current supplied to the second signal line when the second pixel signal of a fourth pixel located at the $d^{th}$ column and an $f^{th}$ row different from the $e^{th}$ row is transmitted, where each of e and f is an integer of 1 to m.

Thus, in this imaging device, since the load current for the second pixel and the load current for the fourth pixel can be individually controlled, the load currents can be appropriately controlled in accordance with the brightness in each image region.

For example, the imaging device may further include: a second signal line, through which a second pixel signal outputted from each of the pixels in a $d^{th}$ column different from the $a^{th}$ column among the pixels is transmitted, where d is an integer of 1 to n; a second load-current circuit that supplies a second load current to the second signal line; a second control circuit; and a second conversion circuit that converts the second pixel signal into a second digital signal. The comparison circuit may compare the second digital signal with the threshold. In accordance with a magnitude correlation between the second digital signal obtained from a third pixel located at the $d^{th}$ column and an $e^{th}$ row and the threshold, the second control circuit may determine the second load current supplied to the second signal line when the second pixel signal of a fourth pixel located at the $d^{th}$ column and an $f^{th}$ row different from the $e^{th}$ row is transmitted, where each of e and f is an integer of 1 to m. The first control circuit may be located outside a region in which the first load-current circuit and the second load-current circuit are located, the first control circuit being closer to a region in which the first load-current circuit is located. The second control circuit may be located outside the region in which the first load-current circuit and the second load-current circuit are located, the second control circuit being closer to a region in which the second load-current circuit is located.

Thus, in this imaging device, since the load current for the second pixel and the load current for the fourth pixel can be individually controlled, the load currents can be appropriately controlled in accordance with the brightness in each image region. In addition, since the size of the region in which wires through which the control signals are transmitted can be reduced, compared with a case in which the control signals are transmitted from a single first control circuit to the first load-current circuit and the second load-current circuit. Also, since variations in the length of the wires through which the control signals are transmitted can be reduced, it is possible to reduce variations in the control signals supplied to the load-current circuits.

For example, the threshold may include a first threshold and a second threshold greater than the first threshold. In accordance with a magnitude correlation between the first digital signal obtained from the first pixel and the first and second thresholds, the first control circuit may determine the current value of the first load current supplied to the first signal line when the first pixel signal of the second pixel is transmitted.

Thus, in this imaging device, the load currents can be appropriately controlled through use of the plurality of thresholds.

A camera system according to one aspect of the present disclosure includes: the imaging device, which is any one of the imaging devices described above; and a camera signal processor that processes a signal outputted from the imaging device.

Thus, in the camera system, a load current when a signal of the second pixel is transmitted can be determined in accordance with the signal level of the first pixel. Thus, for example, since the load currents when the brightness is low can be reduced, the camera system can reduce the power consumption.

It should be noted that general or specific embodiments may be implemented as a system, a method, an integrated circuit, a computer program, a computer-readable storage medium such as a CD-ROM, or any selective combination thereof.

Imaging devices according to embodiments of the present disclosure will be described below with reference to the accompanying drawings. However, an overly detailed description may be omitted herein. For example, a detailed description of already well-known things and a redundant description of substantially the same configuration may be omitted herein. This is to avoid the following description becoming overly redundant and to facilitate understanding of those skilled in the art. The accompanying drawings and the following description are provided so as to allow those skilled in the art to fully understand the present disclosure and are not intended to limit the subject matters recited in the claims.

First Embodiment

[Basic Configuration of Imaging Device]

First, a description will be given of an overview of an imaging device according to the present embodiment. FIG. 1 is a block diagram of an imaging device according to a first embodiment. As illustrated in FIG. 1, an imaging device 200 according to the present embodiment is a solid-state imaging device and is, for example, a CMOS image sensor. The imaging device 200 includes a pixel section 201, a vertical scanning circuit 202, a horizontal scanning circuit 203, a control circuit 205, a column processing section 206, a reference-signal generating circuit 204, a plurality of vertical signal lines 212, a horizontal signal line 213, an amplifying circuit 214, a memory 216, and a comparison circuit 217.

The pixel section 201 includes a plurality of pixels arranged in a matrix. Each pixel photoelectrically converts incident light to generate a pixel signal, which is an electrical signal.

The vertical scanning circuit 202 controls row addresses and row scanning. The vertical signal lines 212 are provided in respective columns and are connected to the pixels arranged in the respective columns. Each vertical signal line 212 transmits the pixel signals generated by the pixels arranged in the corresponding column to the column processing section 206.

The column processing section 206 includes a plurality of load-current circuits 215 and a plurality of column A/D circuits 207. One load-current circuit 215 and one column A/D circuit 207 are provided for each column. When the pixel signals are transmitted to the vertical signal line 212 in the corresponding column, the corresponding load-current circuit 215 supplies a load current to the vertical signal line 212.

Each column A/D circuit 207 is a conversion circuit that is connected to the vertical signal line 212 in the corresponding column and that converts the pixel signals, which are analog signals transmitted to the vertical signal line 212, into digital signals. Each column A/D circuit 207 includes a comparator 208, a counter 209, a switch 210, and a memory 211.

The reference-signal generating circuit 204 generates a reference signal RAMP and supplies the generated reference signal RAMP to the comparators 208.

The horizontal scanning circuit 203 controls column addresses and column scanning. The horizontal signal line 213 transmits digital signals generated by the column processing section 206. The amplifying circuit 214 is connected to the horizontal signal line 213 and outputs the digital signals, transmitted to the horizontal signal line 213, to outside of the imaging device 200 as video data.

The memory 216 temporarily stores therein any of the digital signals generated by the column processing section 206. The comparison circuit 217 compares the digital signal stored in the memory 216 with a predetermined threshold.

The control circuit 205 controls the vertical scanning circuit 202, the horizontal scanning circuit 203, and the column processing section 206.

[A/D Conversion Operation]

Next, a description will be given of A/D conversion operation in the imaging device 200. The imaging device 200 according to the present embodiment is an image sensor based on a column-parallel A/D conversion system. When the imaging device 200 is to capture a desired image, the pixel section 201 converts light that is incident on the imaging device 200 into pixel signals, which are electrical signals.

The vertical scanning circuit 202 controls the pixel section 201 for each row. Pixel signals generated by the pixels belonging to the row selected by the vertical scanning circuit 202 are outputted to the vertical signal lines 212 at the same time. At this point in time, the load-current circuits 215 supply load currents to the corresponding vertical signal lines 212.

Each comparator 208 compares the pixel signals in the corresponding column with the reference signal RAMP outputted by the reference-signal generating circuit 204. In this case, the reference signal RAMP is a ramp signal whose voltage value has a gradient and that at least increases monotonically or decreases monotonically. Each counter 209 counts a period from start of a counting period until reversal of a magnitude correlation between the pixel signals and the reference signal RAMP. With this configuration, the pixel signals, which are analog signals, are converted into digital signals. That is, each comparator 208 and the counter 209 corresponding thereto constitute an A/D conversion circuit, and the A/D conversion circuit for the corresponding column converts the pixel signals in the column from analog signals into digital signals. Thus, each column A/D circuit 207 is an A/D converter that converts, for the respective pixels, the pixel signals generated in the pixel section 201 from analog signals into digital signals.

The pixel signals from each column which were converted into the digital signals are stored in the memory 211 in the corresponding column via the corresponding switch 210 whose electrical continuity/discontinuity is switched by the control circuit 205. The digital signals stored in the memories 211 are sent through the horizontal signal line 213 in the order that the columns are selected by the horizontal scanning circuit 203, are amplified by the amplifying circuit 214, and are outputted to an external signal processing circuit or the like.

Also, based on a master clock (MCLK) signal inputted via an MCLK terminal and data signals inputted via a DATA terminal and used for various settings, the control circuit 205 collectively generates various internal clocks and supplies the generated internal clocks to the individual circuits in the imaging device 200. Specifically, the control circuit 205 supplies a control signal CN1 to the vertical scanning circuit 202 and supplies a control signal CN2 to the horizontal scanning circuit 203. The control circuit 205 also supplies a control signal CN3 and a clock signal CLK1 for reference-signal generation to the reference-signal generating circuit 204. Also, the control circuit 205 supplies a control signal CN4 and a clock signal CLK2 for counting to the counters 209, supplies a control signal CN5 to the switches 210, supplies a control signal CN6 for current-value change to the load-current circuits 215, and supplies a control signal CN7 for current-value change to the comparators 208. These circuits operate in accordance with the corresponding control signals.

[Operation of Column A/D Circuit]

Next, a description will be given of an operation when the column A/D circuits 207 perform A/D conversion on the pixel signals. As described below, the imaging device 200 according to the present embodiment has a normal mode, a dark-time mode, and a bright-time mode as operation modes. The operation of the normal mode will be described first.

Figure 2:
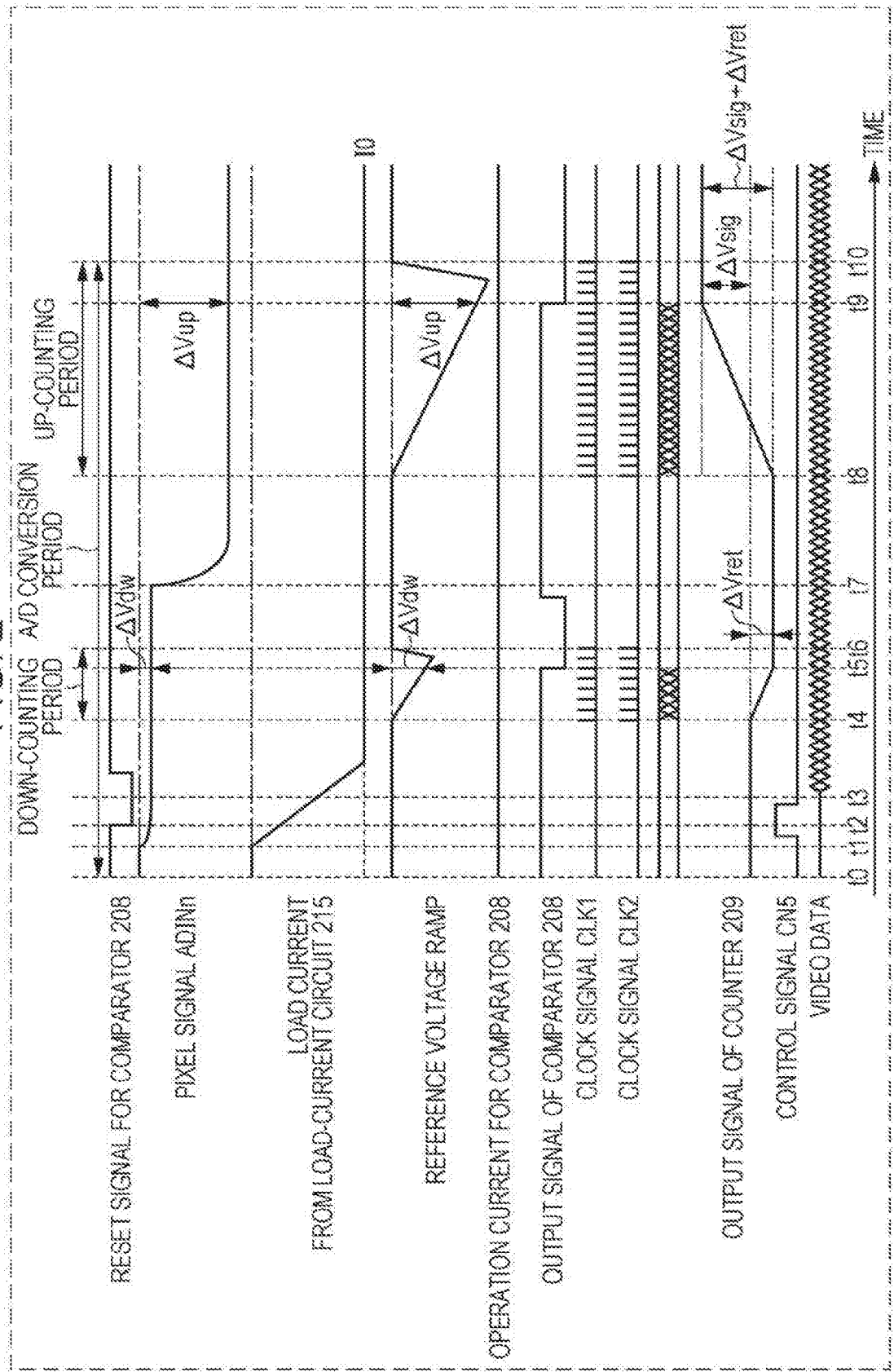
FIG. 2 is a timing chart illustrating an example operation during a normal mode in one horizontal-scanning period of the imaging device in the first embodiment.

FIG. 2 is a timing chart illustrating an example operation during a normal mode in one horizontal-scanning period in the imaging device 200 in the present embodiment.

First, at time t0, the control circuit 205 sends the control signal CN4 to the counters 209 to reset count values of the counters 209 to an initial value and to set the operation mode of the counters 209 to a down-counting mode. Also, the control circuit 205 sends the control signal CN1 to thereby read reset components of the pixels belonging to a desired row of the rows as pixel signals ADIN0 to ADINp at time t1. In FIG. 2, one of the pixel signals ADIN0 to ADINp is denoted as ADINn.

At time t2, the control circuit 205 sends a reset signal RST to the comparators 208 to reset the comparators 208 to an initial state. Also, the load-current circuits 215 supplies load currents with a current value I0 to the corresponding vertical signal lines 212.

At time t3, after the pixel signals in the vertical signal lines 212 stabilize, the control circuit 205 supplies the control signal CN3 and the clock signal CLK1 to the reference-signal generating circuit 204. In response to the control signal CN3 and the clock signal CLK1, at time t4, the reference-signal generating circuit 204 starts changing the reference signal RAMP with time. At the same time, the control circuit 205 starts supplying the clock signal CLK2 to the counters 209. In response to the clock signal CLK2, the counters 209 starts down-counting from the initial value.

In this case, the control circuit 205 generates the clock signals CLK1 and CLK2, for example, through multiplication of the MCLK signal. Although an example in which the clock signals CLK1 and CLK2 operate at the same time is described in this case, this operation timing is one example, and the clock signal CLK2 may be delayed according to a circuit operation.

At time t5, the value of the reference signal RAMP and a value ΔVdw of reset components in the vertical signal lines 212 match each other. Thus, output signals SOUT of the comparators 208 are inverted, so that the counters 209 stops the down-counting. The count value at this point in time corresponds to ΔVret in FIG. 2.

At time t6, when the down-count period passes, the control circuit 205 stops supplying the clock signal CLK1 to the reference-signal generating circuit 204 and simultaneously stops supplying the clock signal CLK2 to the counters 209.

Subsequently, the control circuit 205 supplies the control signal CN4 to the counters 209 to set the operation mode of the counters 209 to an up-counting mode. Also, at time t7, the control circuit 205 supplies the control signal CN1 to thereby read signal components ΔVsig of the pixels belonging to a desired one of the rows as the pixel signals ADIN0 to ADINp.

A method for reading the signal components ΔVsig is analogous to the method for reading the reset components, except that the operation mode for the counters 209 is set to the up-counting mode. That is, after the pixel signals in the vertical signal lines 212 stabilize, the control circuit 205 supplies the control signal CN3 and the clock signal CLK1 to the reference-signal generating circuit 204. In response to the control signal CN3 and the clock signal CLK1, at time t8, the reference-signal generating circuit 204 starts changing the reference signal RAMP with time.

At time t9, the value of the reference signal RAMP and a value ΔVup of the signal components match each other. Thus, the output signals SOUT of the comparators 208 are inverted, so that the counters 209 stop the up-counting. The count value at this point in time corresponds to $\Delta Vsig+\Delta Vret$ in FIG. 2.

Lastly, at time t10, when the down-count period passes, the control circuit 205 stops supplying the clock signal CLK1 to the reference-signal generating circuit 204 and simultaneously stops supplying the clock signal CLK2 to the counters 209.

As described above, down-counting is set for the counters 209 when the reset components $\Delta Vret$ are to be read, and up-counting is set for the counters 209 when the signal components $\Delta Vsig$ are to be read, so that addition and subtraction are automatically performed in the counters 209. This makes it possible to obtain a count value corresponding to the signal components $\Delta Vsig$. Although an example in which the reset components are obtained during down-counting, and the signal components are obtained during up-counting has been described above, this is merely an example. That is, the signal components may be obtained during down-counting, and the reset components may be obtained during up-counting.

Also, although, in the present embodiment, the description has been given using the up-and-down counters as one example of the counters 209, only up-counters or down-counters may be used, and addition and subtraction may be performed at a subsequent stage. That is, any configuration may be employed, as long as it uses a method that can obtain a count value corresponding to the signal component $\Delta Vsig$.

[Reading Operation]

In the imaging device 200 according to the present embodiment, any of the digital signals read in the above-described normal mode is temporarily stored in the memory 216. The comparison circuit 217 compares the digital signal stored in the memory 216 with one or more pre-set thresholds and outputs, to the control circuit 205, a comparison result indicating a magnitude correlation between the digital signal and the threshold(s). In accordance with the comparison result, the control circuit 205 generates the control signal CN6 for the load-current circuits 215, the control signal CN7 for the comparators 208, and the clock signal CLK2 for the counters 209.

Figure 3:
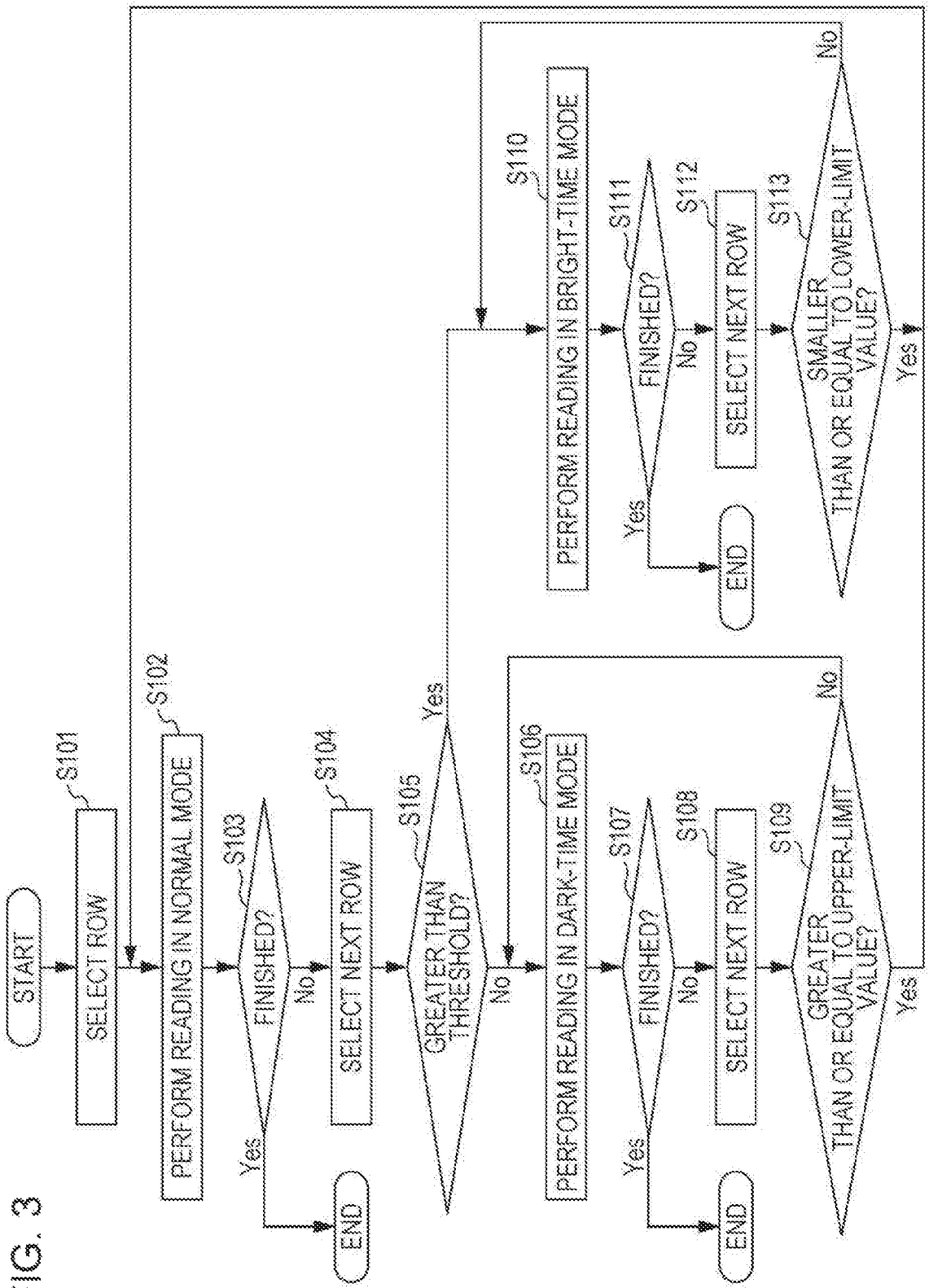
FIG. 3 is a flowchart illustrating processing in the imaging device in the first embodiment.

FIG. 3 is a flowchart illustrating an operation flow of reading processing according to the present embodiment. First, in the imaging device 200, a first row is selected (S101), and the pixel signals of the pixels in the selected row are read in the above-described normal mode (S102). The memory 216 stores any of the read digital signals therein.

Next, the imaging device 200 determines whether or not the photography is to be finished (S103). For example, for a still image, when processing on all rows in one picture is finished, the imaging device 200 determines that the photography is to be finished. For a moving image, the imaging device 200 receives a user's instruction for finishing moving-image photography, and when processing on all rows in a last frame is finished, the imaging device 200 determines that the photography is to be finished.

If the photography is not to be finished (No in S103), the imaging device 200 selects the next row (S104). Next, the comparison circuit 217 compares the digital signal stored in the memory 216 with a threshold (S105). For example, the digital signal of one pixel that is included in the pixels located in the immediately previous row and that is arranged in a predetermined column is stored in the memory 216. The comparison circuit 217 compares the digital signal of the stored pixel with the threshold. Based on the comparison result, the control circuit 205 selects the dark-time mode or the bright-time mode. Specifically, the control circuit 205 selects the dark-time mode when the digital signal is smaller than or equal to the threshold and selects the bright-time mode when the digital signal is greater than the threshold.

The digital signals of two or more pixels of the pixels included in the immediately previous row may be stored in the memory 216, and the comparison circuit 217 may compare each of the digital signals of the two or more pixels with the threshold. In this case, for example, the control circuit 205 selects the dark-time mode when all the digital signals of the two or more pixels are smaller than the threshold, selects the bright-time mode when all the digital signals of the two or more pixels are greater than the threshold, and otherwise selects the normal mode. Alternatively, the comparison circuit 217 may compare a result of calculation (e.g., an average value, a maximum value, a minimum value, or a median) of the digital signals of the two or more pixels with the threshold.

Although an example in which the operation mode is switched for each row is described in this case, the operation mode may be switched for every predefined plurality of rows.

If the digital signal is smaller than or equal to the threshold (No in S105), the imaging device 200 performs reading in the dark-time mode (S106). Specifically, by using the control signal CN6, the control circuit 205 sets the load current to be supplied by the load-current circuits 215 to a value smaller than the value in the normal mode. Also, by using the control signal CN7, the control circuit 205 sets an operation current for the comparators 208. Specifically, in a partial period included in the count period, the control circuit 205 stops the operation of the comparators 208. Also, in the partial period included in the count period, the control circuit 205 stops the clock signal CLK2 to be supplied to the counters 209, to thereby stop the operation of the counters 209. The memory 216 stores any of the read digital signals therein.

Next, as in step S103, the imaging device 200 determines whether or not the photography is to be finished (S107). If the photography is not to be finished (No in S107), the imaging device 200 selects the next row (S108). Next, the comparison circuit 217 compares the digital signal stored in the memory 216 with an upper-limit value (S109). If the digital signal is not greater than or equal to the upper-limit value (No in S109), the process in step S106 and the subsequent processes are performed again. That is, the dark-time mode is continued.

On the other hand, if the digital signal is greater than or equal to the upper-limit value (Yes in S109), the process in step S102 and the subsequent processes are performed again. That is, the operation mode is changed to the normal mode.

Also, if the digital signal is greater than the threshold in step S105 (Yes in S105), the imaging device 200 performs reading in the bright-time mode (S110). Specifically, by using the control signal CN6, the control circuit 205 sets the load current to be supplied by the load-current circuits 215 to a value greater than that in the dark-time mode. For example, the control circuit 205 sets the load current to be supplied by the load-current circuits 215 to a value that is the same as the value in the normal mode.

Also, by using the control signal CN7, the control circuit 205 sets the operation current for the comparators 208. Specifically, in a partial period in the count period, the control circuit 205 stops the operation of the comparators 208. Also, in the partial period in the counting period, the control circuit 205 stops the clock signal CLK2 to be supplied to the counters 209, to thereby stop the operation of the counters 209. The memory 216 stores any of the read digital signals therein.

Next, as in step S103, the imaging device 200 determines whether or not the photography is to be finished (S111). If the photography is not to be finished (No in S111), the imaging device 200 selects the next row (S112). Next, the comparison circuit 217 compares the digital signal stored in the memory 216 with a lower-limit value (S113). If the digital signal is not smaller than or equal to the lower-limit value (No in S113), the process in step S110 and the subsequent processes are performed again. That is, the bright-time mode is continued.

On the other hand, if the digital signal is smaller than or equal to the lower-limit value (Yes in S113), the process in step S102 and the subsequent processes are performed again. That is, the operation mode is changed to the normal mode.

As described above, in accordance with the magnitude correlation between the digital signal and the threshold, the imaging device 200 according to the present embodiment controls the current value of the load-current circuits 215 and the comparators 208 and the clock signal CLK2 for the counters 209. This makes it possible to reduce the power consumption and suppress noise.

Figure 4:
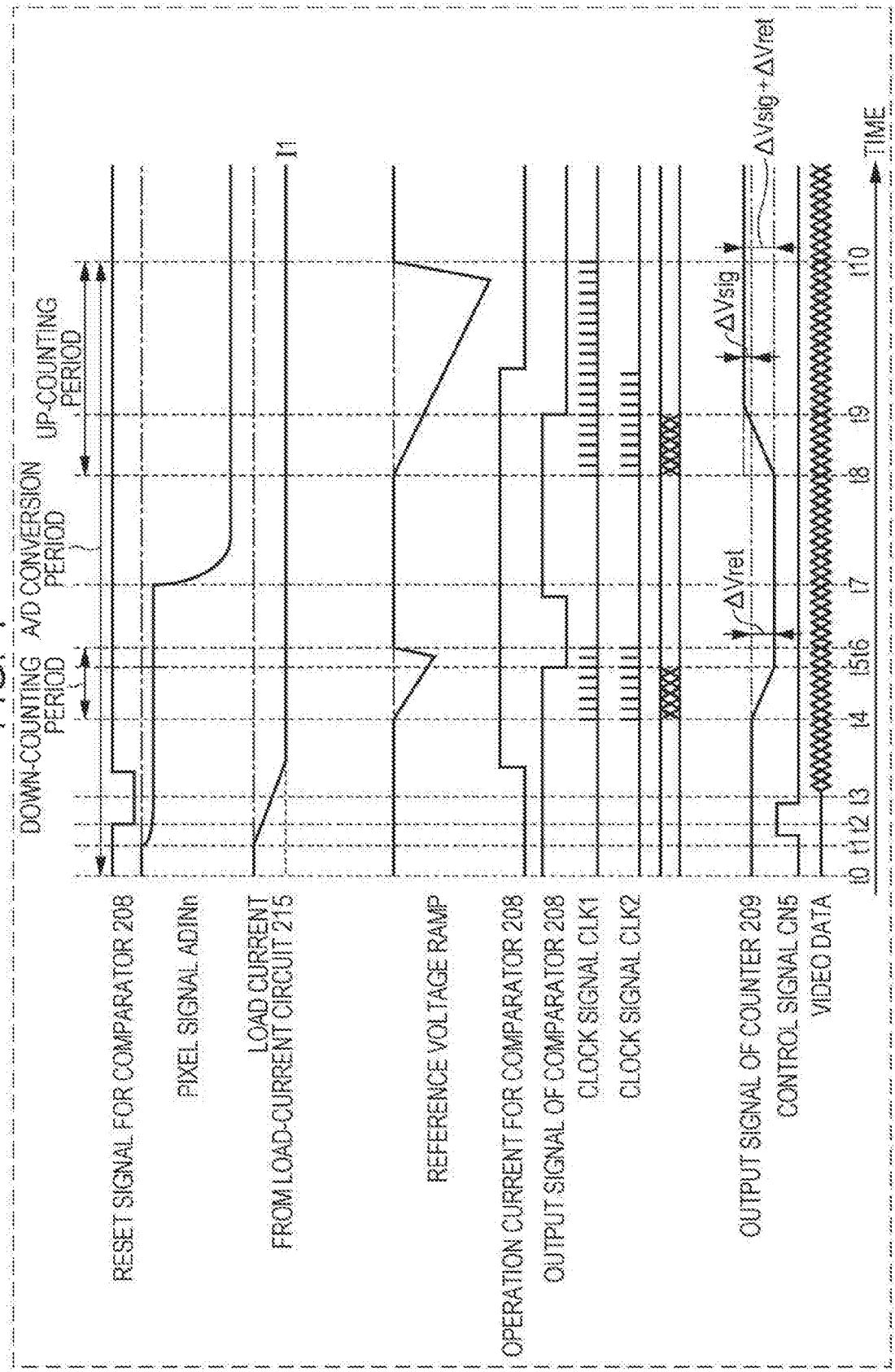
FIG. 4 is a timing chart illustrating an example operation of one horizontal-scanning period during a dark-time mode in the imaging device in the first embodiment.
Figure 5:
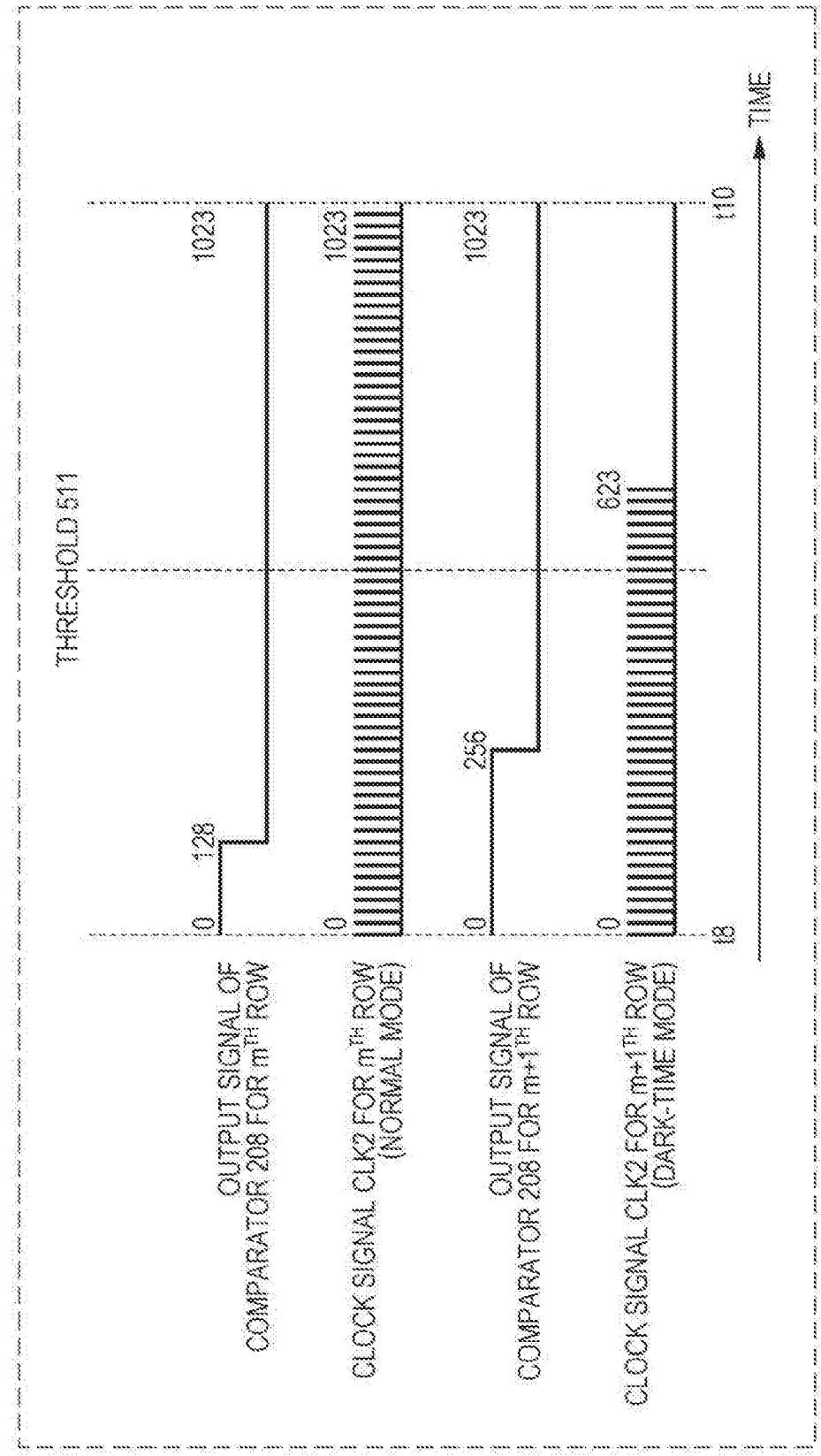
FIG. 5 is a timing chart illustrating an example operation of a counter in an up-counting period during the dark-time mode in the imaging device in the first embodiment.

Details of operations in the dark-time mode and the bright-time mode will be described below. The operation in the dark-time mode will be described first. FIG. 4 is a timing chart illustrating an A/D conversion operation in the dark-time mode in the imaging device 200. FIG. 5 is a timing chart illustrating one example of the operation in an up-counting period in the dark-time mode in the present embodiment. In this example, each digital signal, which indicates a count value, indicates 0 to 1023, and the threshold is 511.

As illustrated in FIG. 5, in A/D conversion for the $m^{th}$ row, an output signal Sm of the comparator 208 is inverted at the $128^{th}$ clock, and the counting operation in the counter 209 finishes. Then, a count value "128" is held in the memory 216. The comparison circuit 217 compares the count value "128" with the threshold "511". In this case, since the count value "128" for the $m^{th}$ row is smaller than the threshold "511", the control circuit 205 sets the operation mode for the $m+1^{th}$ row to the dark-time mode.

Specifically, as illustrated in FIG. 5, in the normal mode, the control circuit 205 supplies the clock signal CLK2 in the entire period in the up-counting period. On the other hand, in the dark-time mode, the control circuit 205 supplies the clock signal CLK2 in a first period included in the up-counting period and supplies the clock signal CLK2 in a second period that is included in the up-counting period and that is subsequent to the first period.

In this case, it is desirable that the number of clocks in each counter 209 in the dark-time mode and the bright-time mode have a margin centered on the threshold "511". Specifically, in the example illustrated in FIG. 5, with respect to the threshold "511", the count value in the dark-time mode is set to a value between "0" and an upper-limit value "623". This upper-limit value is used in the determination in step S109 illustrated in FIG. 3. By controlling the clock signal CLK2 for the counter 209 so as to cross the threshold, it is possible to reduce the risk of being unable to perform counting when illuminance variations across the threshold occur for each row.

In addition, as illustrated in FIG. 4, the control circuit 205 makes a current value I1 of the load current supplied by each load-current circuit 215 smaller than a current value I0 of the load current in the normal mode illustrated in FIG. 2. In this case, increment in the load current increases the maximum value of the amplitude of each pixel signal. That is, when the pixel signal is large, the load current also needs to be large, but when the pixel signal is small, the load current does not need to be large. Hence, when the pixel signal is small, a reduction in the load current makes it possible to reduce the power consumption without affecting the circuit operation.

Also, as illustrated in FIG. 4, in the partial period included in the up-counting period, the control circuit 205 reduces the operation current of the comparator 208. For example, the control circuit 205 stops the comparator 208. Specifically, the control circuit 205 also stops the comparator 208 at a timing when the clock signal CLK2 is stopped. As a result, the power consumption decreases. The period in which the comparator 208 illustrated in FIG. 4 operates is one example, and it is sufficient that the comparator 208 operates in a period in which the clock signal CLK2 is supplied. Rather than stopping the comparator 208 in a period in which the clock signal CLK2 is not supplied, the control circuit 205 may make the operation current of the comparator 208 smaller than the operation current in the normal mode.

Figure 6:
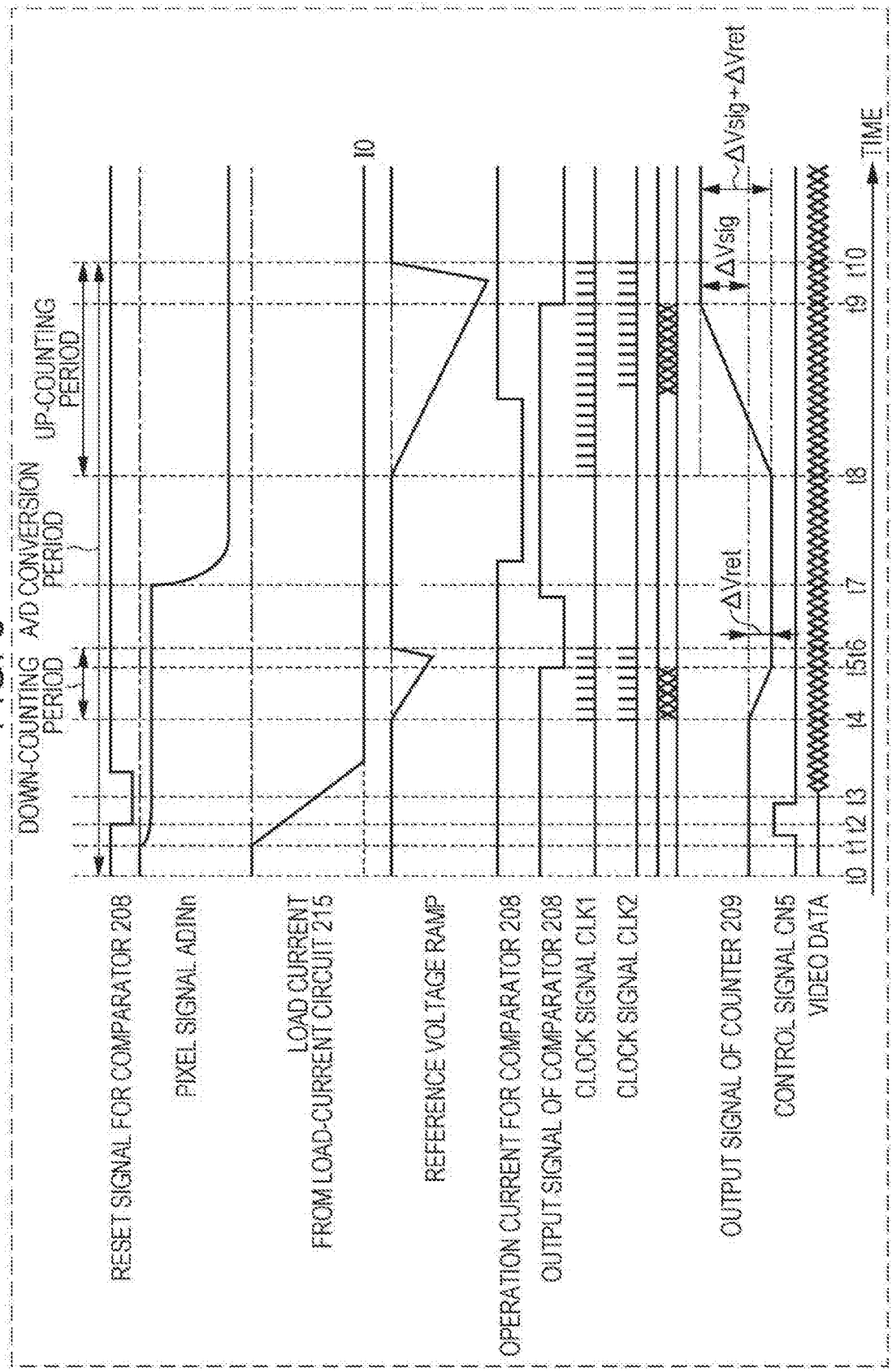
FIG. 6 is a timing chart illustrating an example operation in one horizontal-scanning period during a bright-time mode in the imaging device in the first embodiment.

Next, a description will be given of an operation in the bright-time mode. FIG. 6 is a timing chart illustrating an A/D conversion operation in the bright-time mode in the imaging device 200. FIG. 7 is a timing chart illustrating one example of an operation in an up-counting period in the bright-time mode.

As illustrated in FIG. 7, in the A/D conversion for the $m^{th}$ row, at the $600^{th}$ clock, the output signal of each comparator 208 is inverted, and the counting operation of the corresponding counter 209 finishes. Then, a count value "600" is held in the memory 216. The comparison circuit 217 compares the count value "600" with the threshold "511". In this case, since the count value "600" for the $m^{th}$ row is greater than the threshold "511", the control circuit 205 sets the operation mode for the $m+1^{th}$ row, which is the next row of the $m^{th}$ row, to the bright-time mode.

Specifically, as illustrated in FIG. 7, in the bright-time mode, the control circuit 205 stops supplying the clock signal CLK2 in a first period included in the up-counting period and supplies the clock signal CLK2 in a second period that is included in the up-counting period and that is subsequent to the first period. More specifically, the control circuit 205 stops counting of 0 to 399 of the clock signal CLK2.

Since the clocks 0 to 399 of the clock signal CLK2 for the counter 209 are stopped in the bright-time mode, the normal counting operation is not performed. However, after the counting is finished, a processing block at a subsequent stage can obtain an accurate count value by performing addition for 400 counts.

Also, it is desirable that the count value of the clock signal CLK2 in the dark-time mode and the count value of the clock signal CLK2 in the bright-time mode be generally the same in order to suppress variations in currents consumed in the respective columns, the variations being associated with the count value of clocks in the counter 209. In the present embodiment, the number of clocks is adjusted to about 600.

Also, as illustrated in FIG. 6, the control circuit 205 sets the load current supplied by the load-current circuits 215 to the current value I0 that is the same as that of the load current in the normal mode.

Also, as illustrated in FIG. 6, in a partial period included in the up-counting period, the control circuit 205 reduces the operation current of the comparator 208. For example, the control circuit 205 stops the comparator 208. Specifically, the control circuit 205 operates the comparator 208 at a timing when the clock signal CLK2 is supplied. This reduces the power consumption. The period in which the comparator 208 illustrated in FIG. 6 operates is one example, and it is sufficient that the comparator 208 operates in a period in which the clock signal CLK2 is supplied.

There are also cases in which the count value for the $m+1^{th}$ row deviates from the count range in the dark-time mode or the bright-time mode. FIG. 8 is a diagram illustrating one example of an operation in the up-counting period in this case. In the example illustrated in FIG. 8, the count value for the $m^{th}$ row is "128", and the operation mode for the $m+1^{th}$ row is set to the dark-time mode. Also, it is assumed that inversion of the output signal of the comparator 208 for the $m+1^{th}$ row occurs at the $650^{th}$ count. In this case, counting for the $m+1^{th}$ row is not correctly performed, and for example, the upper-limit value "623" is stored in the memory 216 as a count value. The comparison circuit 217 compares the count value "623" with the upper-limit value "623". Since the count value matches the upper-limit value, the control circuit 205 sets the operation mode for the $m+2^{th}$ row, which is the next row of $m+1^{th}$ row, to the normal mode.

As described above, in accordance with the signal levels of the pixels in one row, the imaging device 200 according to the present embodiment can determine the load current for the pixels in the next row. Thus, since the imaging device 200 can reduce the load current when the brightness is low, it is possible to reduce the power consumption.

Also, in accordance with the signal levels of the pixels in one row, the imaging device 200 determines a period that is included in the counting period for the pixels in the next row and in which the clock signal CLK2 is supplied to the counters 209. Specifically, in accordance with the brightness, the imaging device 200 supplies the clock signal CLK2 to the counter 209 in a partial period and stops supplying the clock signal CLK2 in another period. This makes it possible to reduce the power consumption.

Also, in accordance with the signal levels of the pixels in one row, the imaging device 200 can control the operation current for the comparators 208 in the counting period for the pixels in the next row. Specifically, since the imaging device 200 can reduce the operation current for the comparators 208 in a partial period in accordance with the brightness, it is possible to reduce the power consumption.

Although the above description has been given of an example in which the imaging device 200 controls all of the load current, the clock signal CLK2, and the operation current for the comparators 208, the imaging device 200 may control at least one of the load current, the clock signal CLK2, and the operation current for the comparators 208.

In addition, the above description has been given of an example in which, in the dark-time mode and the bright-time mode, the operation mode is changed to the normal mode in the next row when the digital signal is greater than or equal to the upper-limit value or is smaller than or equal to the lower-limit value. However, in the dark-time mode, the operation mode may be changed to the bright-time mode when the digital signal is greater than or equal to the upper-limit value, and in the bright-time mode, the operation mode may be changed to the dark-time mode when the digital signal is smaller than or equal to the lower-limit value.

Also, the above description has been given of an example in which three modes, that is, the normal mode, the dark-time mode, and the bright-time mode, are switched, the imaging device 200 may perform, as the operation in the bright-time mode, an operation that is the same as the operation in the normal mode.

In addition, the above description has been given of an example in which, in the dark-time mode and the bright-time mode, the operation mode is changed to the normal mode in the next row when the digital signal is greater than or equal to the upper-limit value or is smaller than or equal to the lower-limit value. However, through use of an arbitrary threshold instead of the upper-limit value or the lower-limit value, the operation mode may be switched depending on whether the digital signal is greater or smaller than the threshold.

Figure 9A:
FIG. 9A illustrates an example image according to the first embodiment.
Figure 9B:
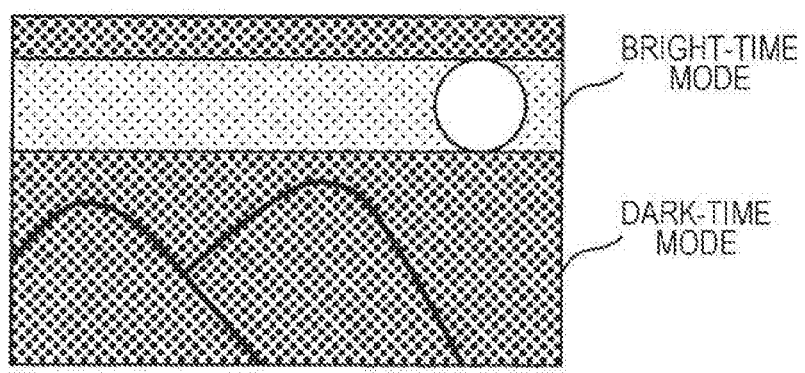
FIG. 9B illustrates an example of regions to which the bright-time mode and the dark-time mode according to the first embodiment are applied.

FIG. 9A illustrates an example image depicting a landscape image of a full moon at night. FIG. 9B illustrates regions to which the bright-time mode and the dark-time mode are applied when the image illustrated in FIG. 9A is captured. It is assumed that, in FIGS. 9A and 9B, the diameter of the full moon corresponds to one-fourth of the number of vertical pixels in the pixel section 201, that is, is equal to one-fourth of the total number of rows. Also, it is assumed that the diameter of the full moon is smaller than one-fourth of the number of horizontal pixels in the pixel section 201. The operation mode for the rows in which the full moon is included and a subject brighter than the full moon is not included is set to the bright-time mode, and the operation mode for the rows in which the full moon is not included is set to the dark-time mode.

In this case, since the size of the full moon corresponds to one-fourth of the total number of rows, the operation mode for one-fourth of the entire frame is set to the bright-time mode, and the operation mode for three-fourths of the entire frame is set to the dark-time mode. If the power when the entire frame is in the bright-time mode is 4000 mW, and the power when the entire frame is in the dark-time mode is 3000 mW, the power is 4000 mW×(¼)+3000 mW×(¾) =3250 mW. Since the power that is consumed when the present embodiment is not applied is 4000 mW, it can be understood that 18.75% of the power can be reduced when the present embodiment is applied.

Modification of First Embodiment

Although the above description has been given of an example in which the imaging device 200 switches between the dark-time mode and the bright-time mode by using one threshold, the imaging device 200 may switch among three or more operation modes by using a plurality of thresholds.

Figure 10:
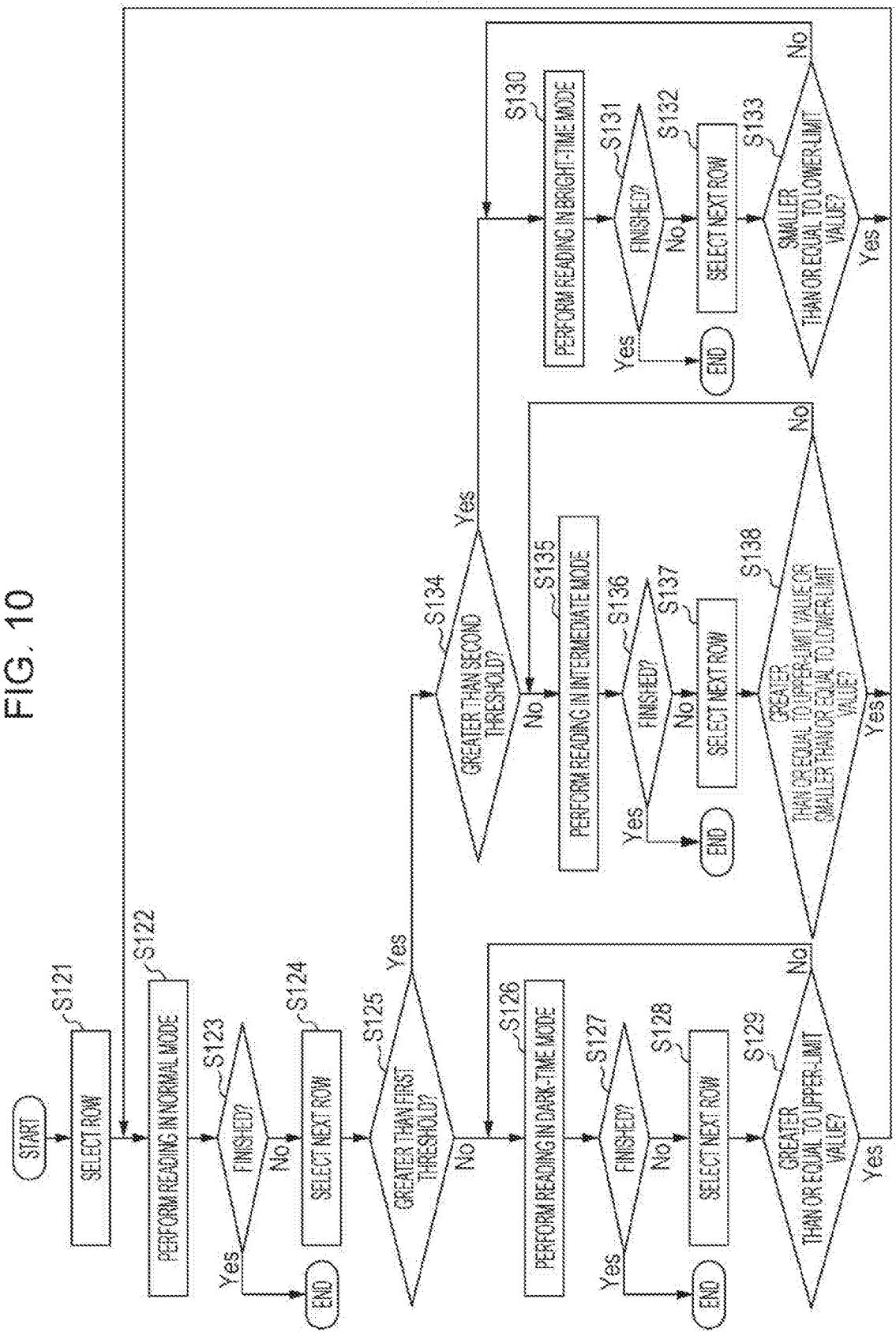
FIG. 10 is a flowchart illustrating comparison processing in the imaging device in a modification of the first embodiment.

FIG. 10 is a flowchart illustrating an operation flow of the imaging device 200 when an intermediate mode is used in addition to the dark-time mode and the bright-time mode. First, similarly to steps S101 to S104 illustrated in FIG. 3, the imaging device 200 selects a first row (S121) and reads pixel signals of the pixels in the first row in the normal mode (S122). If the photography is not to be finished (No in S123), the imaging device 200 selects the next row (S124).

Next, the comparison circuit 217 compares the digital signal stored in the memory 216 with a first threshold (S125).

If the digital signal is smaller than or equal to the first threshold (No in S125), the imaging device 200 performs reading in the dark-time mode, as in steps S106 to S109 illustrated in FIG. 3 (S126). If the photography is not to be finished (No in S127), the imaging device 200 selects the next row (S128). Next, the comparison circuit 217 compares the digital signal stored in the memory 216 with an upper-limit value in the dark-time mode (S129).

On the other hand, if the digital signal is greater than the first threshold in step S125 (Yes in S125), the comparison circuit 217 compares the digital signal stored in the memory 216 with a second threshold (S134). In this case, the second threshold is greater than the first threshold.

If the digital signal is greater than the second threshold (Yes in S134), the imaging device 200 performs reading in the bright-time mode, as in steps S110 to S113 illustrated in FIG. 2 (S130). If the photography is not to be finished (No in S131), the imaging device 200 selects the next row (S132). Next, the comparison circuit 217 compares the digital signal stored in the memory 216 with a lower-limit value in the bright-time mode (S133).

On the other hand, if the digital signal is smaller than or equal to the second threshold (No in S134), that is, the digital signal is greater than the first threshold and is smaller than the second threshold, the imaging device 200 performs reading in the intermediate mode (S135).

Specifically, by using the control signal CN6, the control circuit 205 sets the load current supplied by the load-current circuits 215 to a value that is smaller than the value in the normal mode and the bright-time mode and that is greater than the value in the dark-time mode. Also, by using the control signal CN7, the control circuit 205 sets an operation current for the comparator 208. Specifically, the control circuit 205 stops the operation of the comparator 208 in a partial period in a counting period. Also, in the partial period, the control circuit 205 stops the operation of the counters 209 by stopping the clock signal CLK2 supplied to the counters 209. The memory 216 stores any of the read digital signals therein.

Next, as in step S123, the imaging device 200 determines whether or not the photography is to be finished (S136). If the photography is not to be finished (No in S136), the imaging device 200 selects the next row (S137). Next, the comparison circuit 217 compares the digital signal stored in the memory 216 with an upper-limit value and a lower-limit value in the intermediate mode (S138). If the digital signal indicates a value between the upper-limit value and the lower-limit value (No in S138), the process in step S135 and the subsequent processes are performed again. That is, the intermediate mode is continued.

On the other hand, if the digital signal is greater than or equal to the upper-limit value or is smaller than or equal to the lower-limit value (Yes in S138), the process in step S122 and the subsequent processes are performed again. That is, the operation mode is changed to the normal mode.

Figure 11:
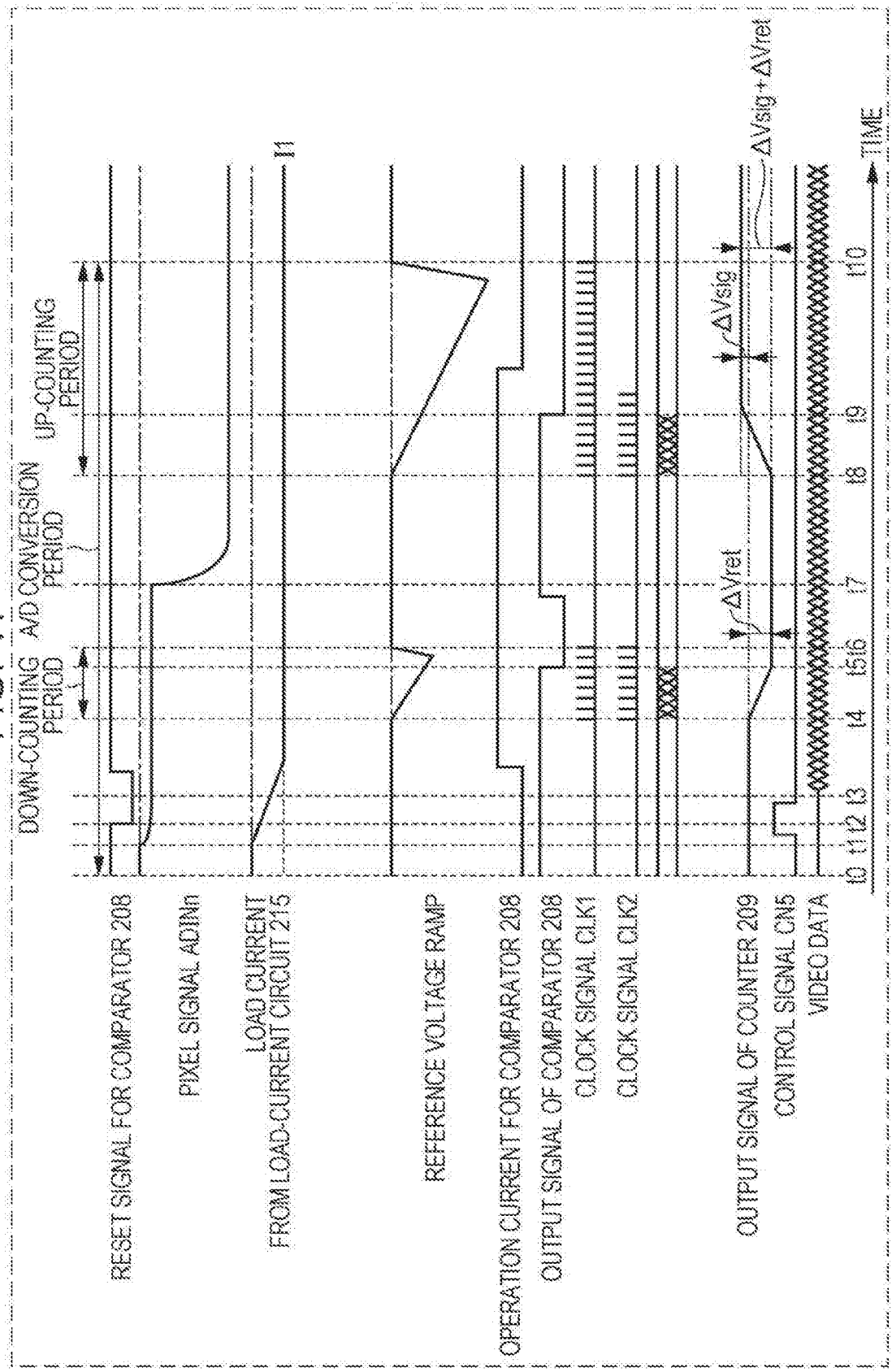
FIG. 11 is a timing chart illustrating an example operation of the counter in one horizontal-scanning period during the dark-time mode in the imaging device in a modification of the first embodiment.
Figure 12:
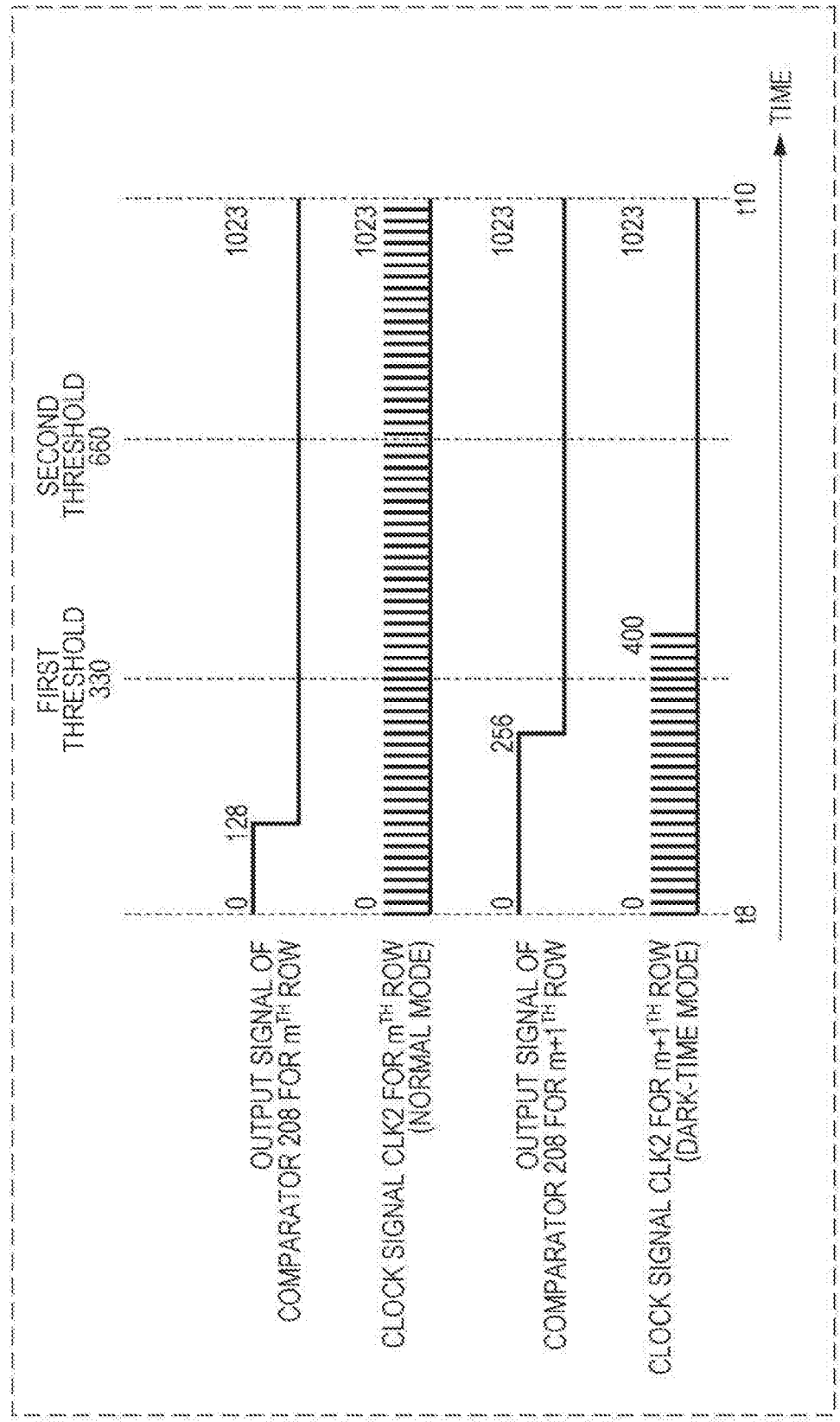
FIG. 12 is a timing chart illustrating an example operation of the counter in the up-counting period during the dark-time mode in the imaging device in the modification of the first embodiment.

An example operation will be described below in detail. FIG. 11 is a timing chart illustrating an operation in the dark-time mode in the imaging device 200 according to a modification of the first embodiment. FIG. 12 is a timing chart illustrating one example of an operation in the up-counting period in the dark-time mode in this modification. In this example, the first threshold is 330, and the second threshold is 660.

In the example illustrated in FIG. 12, a count value for the $m^{th}$ row is "128", and this count value "128" is smaller than the first threshold "330". Hence, the control circuit 205 sets the dark-time mode for the $m+1^{th}$ row.

Specifically, as illustrated in FIG. 12, in the dark-time mode, the control circuit 205 supplies the clock signal CLK2 in a first period included in the up-counting period and stops supplying the clock signal CLK2 in a second period that is included in the up-counting period and that is subsequent to the first period. More specifically, the control circuit 205 stops counting of 401 to 1023 of the clock signal CLK2. That is, the upper-limit value in the dark-time mode in this case is "400".

Also, as illustrated in FIG. 11, the control circuit 205 makes the current value I1 of load current supplied by the load-current circuit 215 smaller than the current value I0 of load current supplied during the normal mode illustrated in FIG. 2.

Also, as illustrated in FIG. 11, in a partial period included in the up-counting period, the control circuit 205 reduces the operation current for the comparator 208. For example, the control circuit 205 stops the comparator 208. Specifically, the control circuit 205 stops the comparator 208 in a period that is included in the up-counting period and in which the clock signal CLK2 is not supplied.

Figure 13:
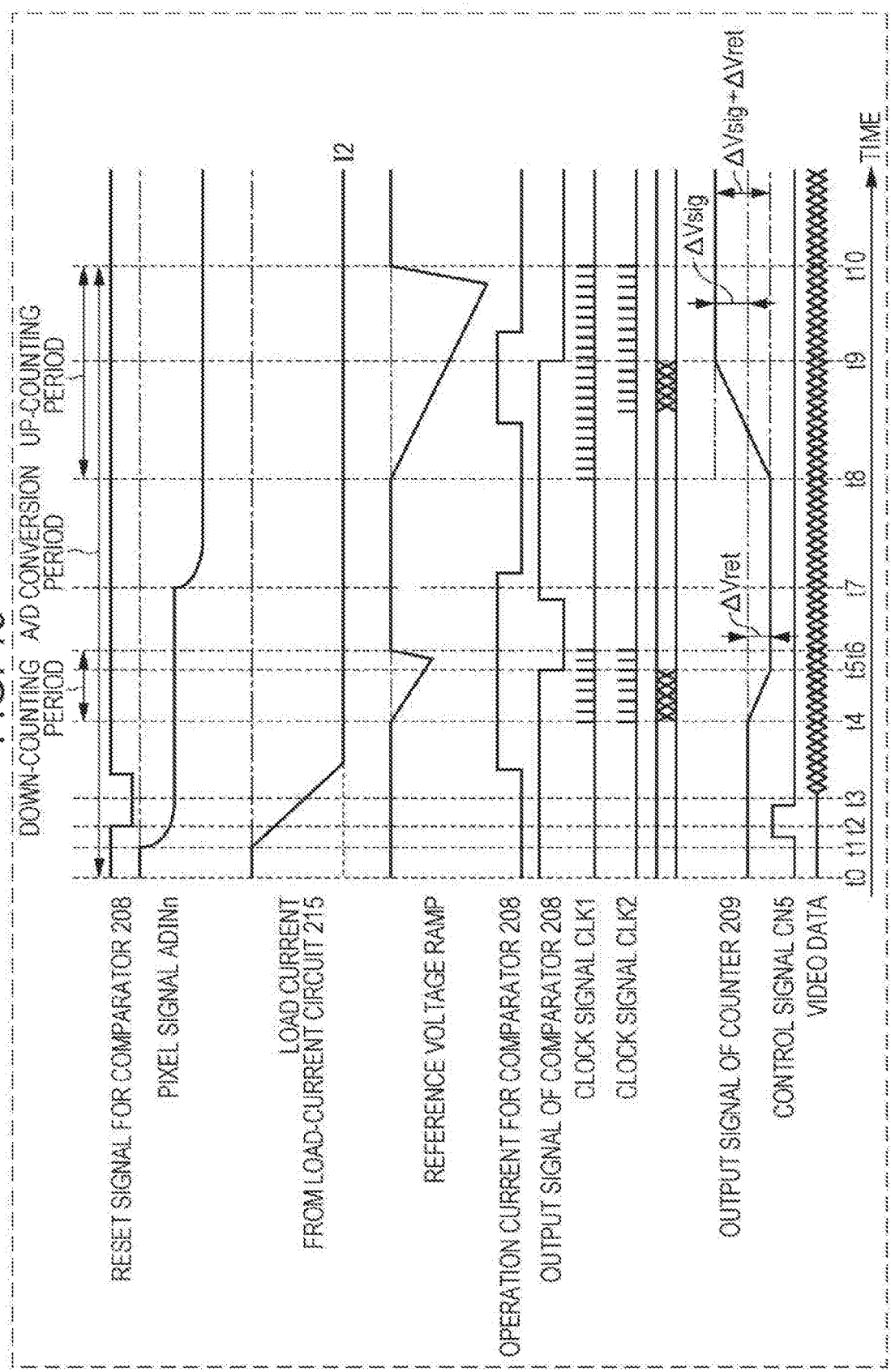
FIG. 13 is a timing chart illustrating an example operation of the counter in one horizontal-scanning period during an intermediate mode of the imaging device in the modification of the first embodiment.
Figure 14:
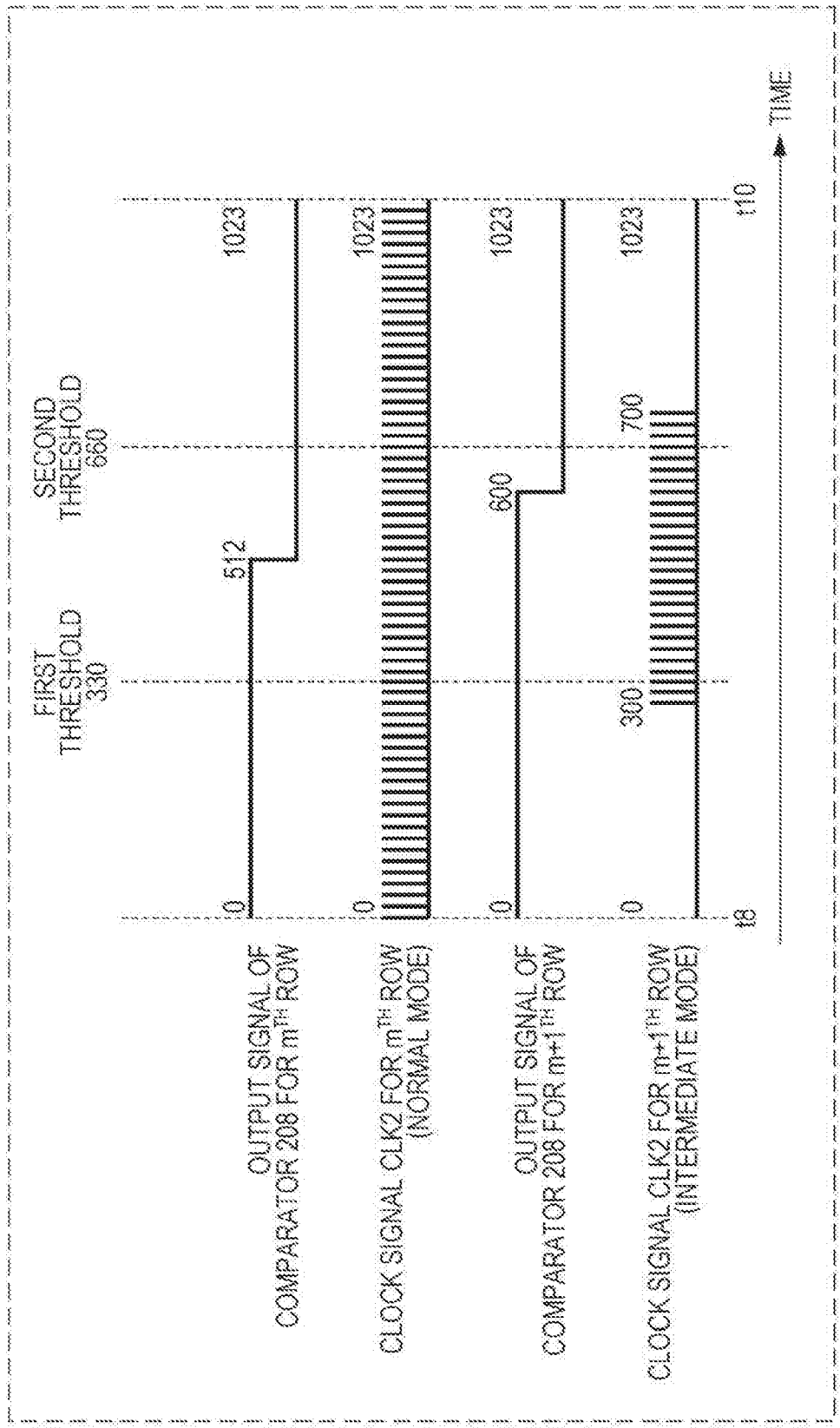
FIG. 14 is a timing chart illustrating an example operation of the counter in an up-counting period during the intermediate mode of the imaging device in the modification of the first embodiment.

FIG. 13 is a timing chart illustrating an operation in the intermediate mode in the imaging device 200 in this modification. FIG. 14 is a timing chart illustrating one example of an operation in an up-counting period in the intermediate mode in this modification.

In the example illustrated in FIG. 14, the count value for the $m^{th}$ row is "512", and this count value "512" is greater than the first threshold "330" and is smaller than the second threshold "660". Hence, the control circuit 205 sets the intermediate mode for the $m+1^{th}$ row.

Specifically, as illustrated in FIG. 14, in the intermediate mode, the control circuit 205 stops supplying the clock signal CLK2 in a first period included in the up-counting period, supplies the clock signal CLK2 in a second period that is included in the up-counting period and that is subsequent to the first period, and stops supplying the clock signal CLK2 in a third period that is included in the up-counting period and that is subsequent to the second period. More specifically, the control circuit 205 stops counting of 0 to 299 of the clock signal CLK2 and counting of 701 to 1023 thereof. That is, the lower-limit value in the intermediate mode in this case "300", and the upper-limit value is "700".

Also, as illustrated in FIG. 13, the control circuit 205 makes a current value I2 of load current supplied by the load-current circuit 215 higher than the current value I1 in the dark-time mode and makes the current value I2 lower than the current value I0 in the normal mode.

Also, as illustrated in FIG. 13, the control circuit 205 makes the operation current for the comparator 208 small in a partial period included in the up-counting period. Specifically, in a period that is included in the up-counting period and in which the clock signal CLK2 is not supplied, the control circuit 205 stops the comparator 208.

Figure 15:
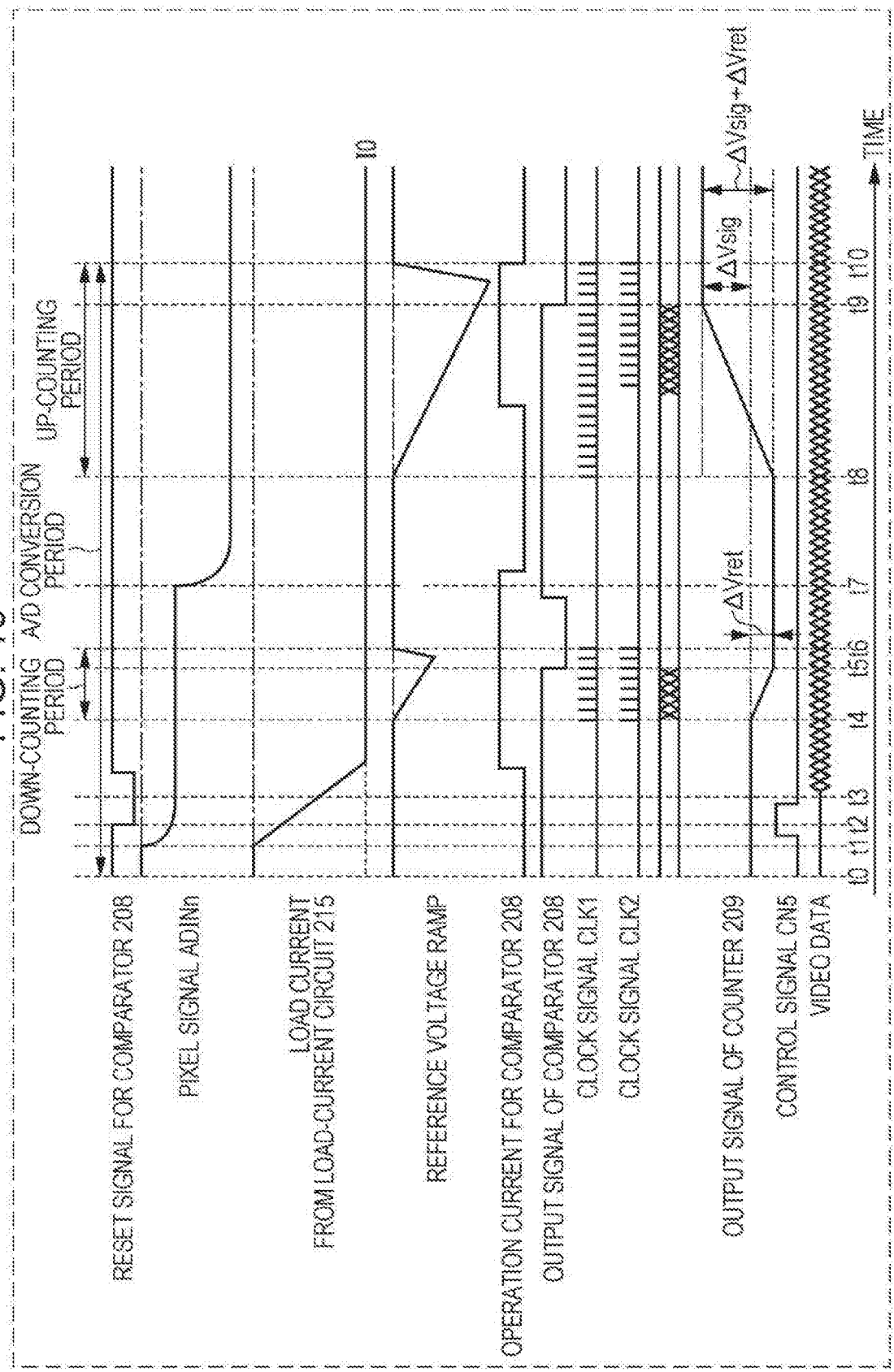
FIG. 15 is a timing chart illustrating an example operation of the counter in one horizontal-scanning period during the bright-time mode in the imaging device in the modification of the first embodiment.
Figure 16:
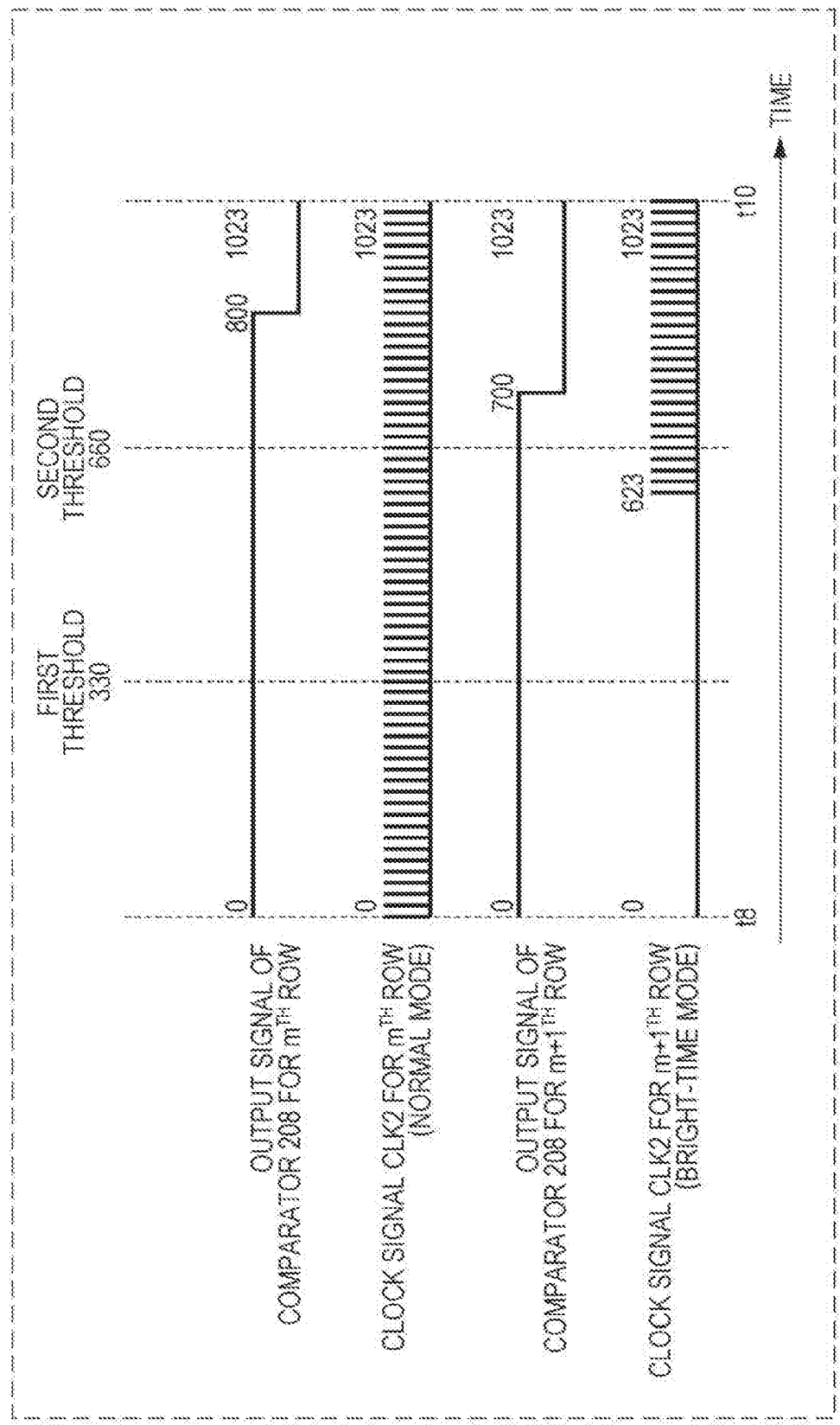
FIG. 16 is a timing chart illustrating an example operation of the counter in the up-counting period during the bright-time mode in the imaging device in the modification of the first embodiment.

FIG. 15 is a timing chart illustrating an operation in the bright-time mode in the imaging device 200 in this modification. FIG. 16 is a timing chart illustrating one example of an operation in the up-counting period in the bright-time mode in this modification.

In the example illustrated in FIG. 16, the count value for $m^{th}$ row is "800", and this count value "800" is greater than the second threshold "660". Hence, the control circuit 205 sets the bright-time mode for the $m+1^{th}$ row.

Specifically, as illustrated in FIG. 16, in the bright-time mode, the control circuit 205 stops supplying the clock signal CLK2 in a first period included in the up-counting period and supplies the clock signal CLK2 in a second period that is included in the up-counting period and that is subsequent to the first period. More specifically, the control circuit 205 stops counting of 0 to 622 of the clock signal CLK2. That is, the lower-limit value for the bright-time mode in this case is "623".

Also, as illustrated in FIG. 15, the control circuit 205 sets the load current supplied by the load-current circuit 215 to the current value I0 that is the same as the load current supplied during the normal mode.

Also, as illustrated in FIG. 15, in a partial period included in the up-counting period, the control circuit 205 makes the operation current for the comparator 208 small. Specifically, in a period that is included in the up-counting period and in which the clock signal CLK2 is not supplied, the control circuit 205 stops the comparator 208.

With the above-described configuration, in this modification, the load current, the operation current for the comparator 208, and the clock signal CLK2 can be more finely controlled than in the first embodiment. Thus, since the power reduction effect can be improved, the amount of heat that is produced can be reduced. Hence, it is possible to reduce noise caused by heat production.

Second Embodiment

In a second present embodiment, a modification of the first embodiment will be described. The following description will be mainly given of differences from the first embodiment described above.

An example in which the operation mode is switched for each row has been described in the first embodiment. In the second embodiment, a description will be given of an example in which the operation mode is switched with finer granularity. In the present embodiment, a description will be given of a case in which the operation mode is switched using two types of load current.

Figure 17:
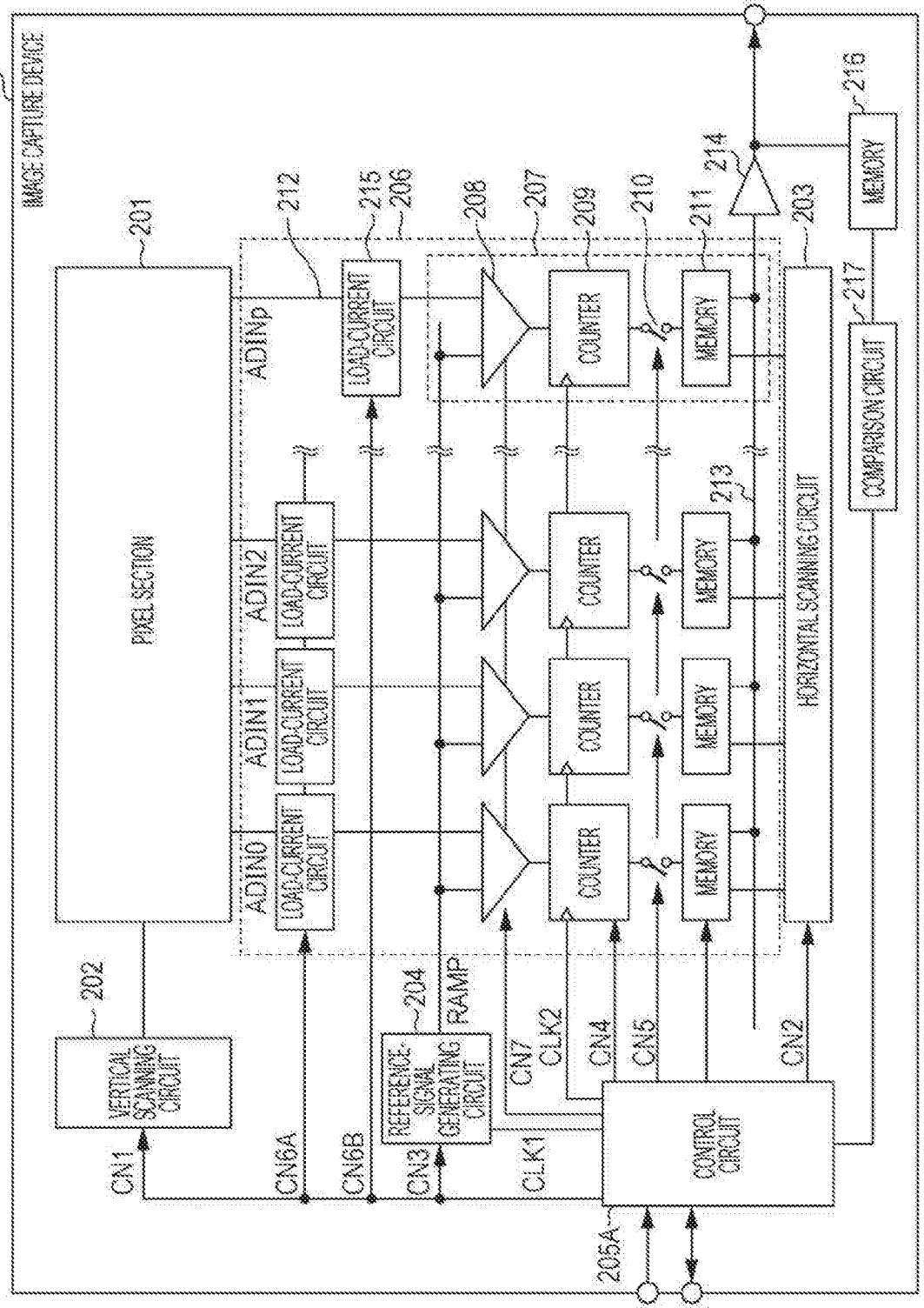
FIG. 17 is a block diagram illustrating an exemplary circuit configuration of an imaging device in a second embodiment.

FIG. 17 is a block diagram illustrating an example configuration of an imaging device 200A according to the present embodiment. The functions of a control circuit 205A in the imaging device 200A illustrated in FIG. 17 differ from those of the control circuit 205 in the imaging device 200 illustrated in FIG. 1. Specifically, the control circuit 205A generates control signals CN6A and CN6B instead of the control signal CN6 for controlling the load current in the load-current circuits 215.

Figure 18:
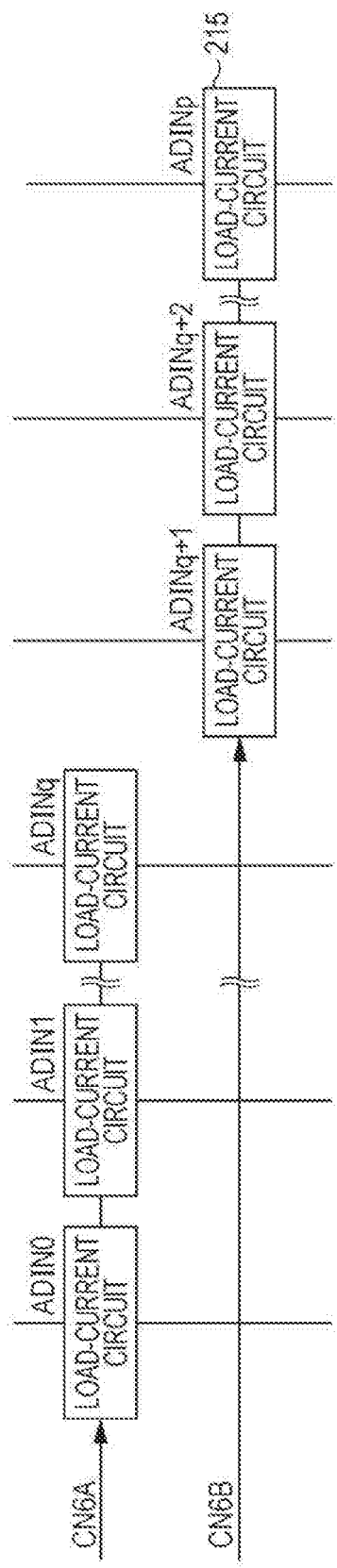
FIG. 18 is a schematic diagram illustrating an example of supply of control signals to load-current circuits in the second embodiment.

FIG. 18 is a diagram illustrating an example of supply of the control signals CN6A and CN6B to the load-current circuits 215 in the present embodiment. The control circuit 205A individually controls the control signals CN6A and CN6B. The control signals CN6A and CN6B are respectively supplied to the load-current circuits 215 in different columns. Specifically, the control signal CN6A is supplied to the load-current circuits 215 connected to the vertical signal lines 212 corresponding to digital signals ADIN0 to ADINq. The control signal CN6B is supplied to the load-current circuits 215 connected to the vertical signal lines 212 corresponding to digital signals ADINq+1 to ADINp. In this case, p and q are integers greater than or equal to 1, and p is greater than q.

Also, by using a scheme that is analogous to that in the first embodiment, the control circuit 205A generates the control signal CN6A in accordance with a result of comparison of the digital signals ADIN0 to ADINq with a threshold. The control circuit 205A also generates the control signal CN6B in accordance with a result of comparison of the digital signals ADINq+1 to ADINp with the threshold.

With the above-described configuration, in the imaging device 200A, the load-current circuits 215 can be divided into two groups and be individually controlled using the two different types of control signal CN6A and CN6B. This enables fine control on the load currents, thus making it possible to further reduce the power consumption.

Figure 19:
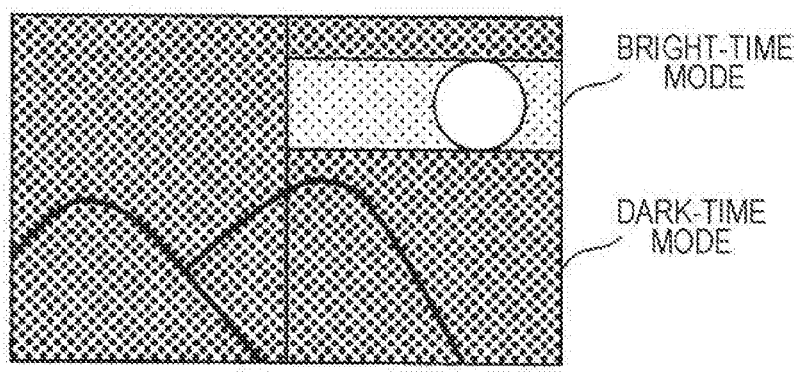
FIG. 19 illustrates one example of regions to which the bright-time mode and the dark-time mode according to the second embodiment are applied.

FIG. 19 illustrates regions to which the bright-time mode and the dark-time mode are applied when the imaging device 200A according to the present embodiment captures the image illustrated in FIG. 9A.

In this case, the size of the full moon is one-fourth of the total number of rows, and the left-and-right individual control can be performed. Thus, the operation mode for one-eighth of the entire frame is set to the bright-time mode, and the operation mode for seven-eighth of the entire frame is set to the dark-time mode. If the power when the entire frame is in the bright-time mode is 4000 mW, and the power when the entire frame is in the dark-time mode is 3000 mW, the power is given by 4000 mW×(1/8)+3000 mW×(7/8)=3125 mW. Since the power that is consumed when the present embodiment is not applied is 4000 mW, it can be understood that the use of the present embodiment can reduce the power by 21.875%. That is, it can be understood that the power consumption can be further reduced, compared with the example illustrated in FIG. 9B.

First Modification of Second Embodiment

Figure 20:
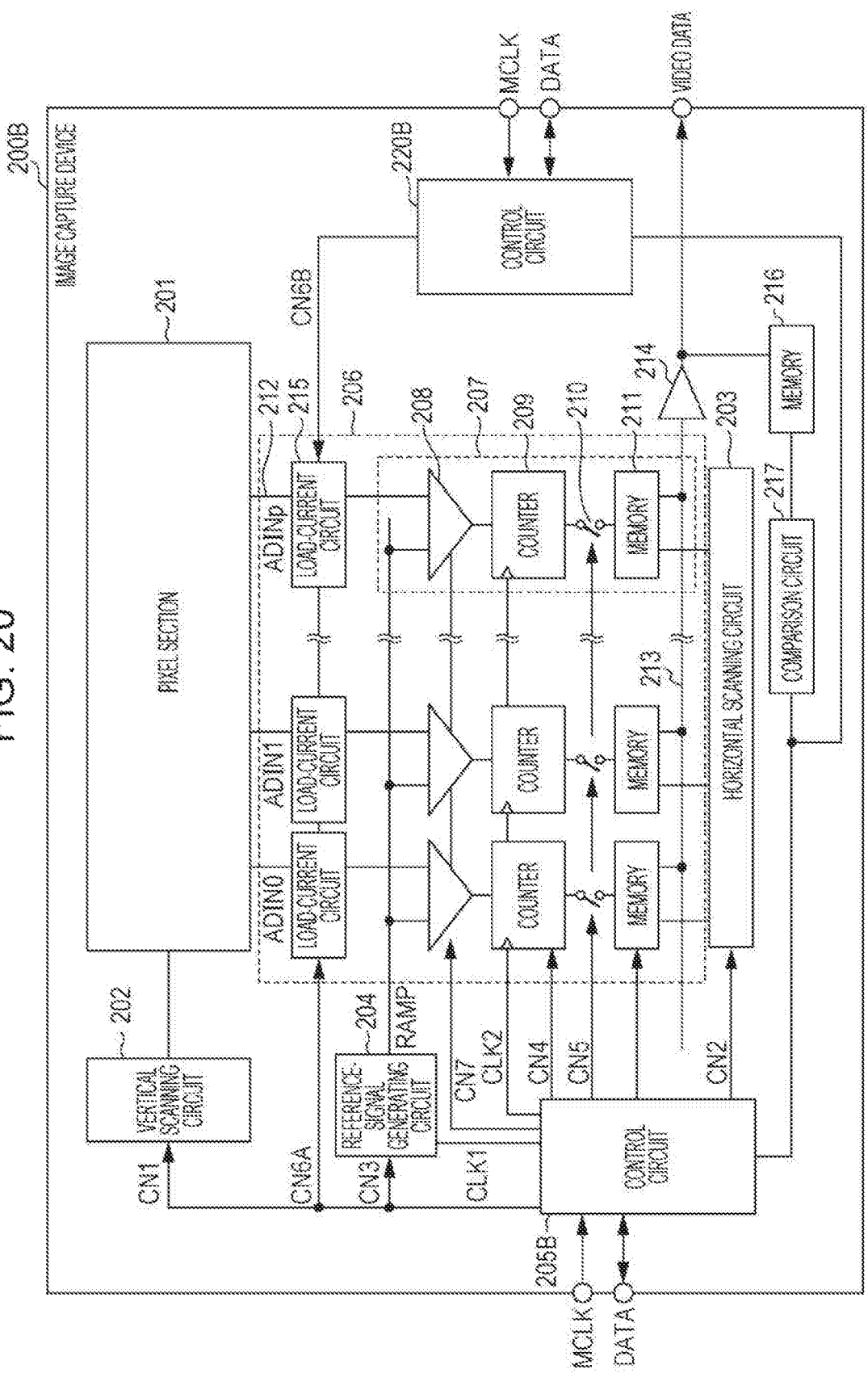
FIG. 20 is a block diagram illustrating an exemplary circuit configuration of an imaging device in a first modification of the second embodiment.
Figure 21:
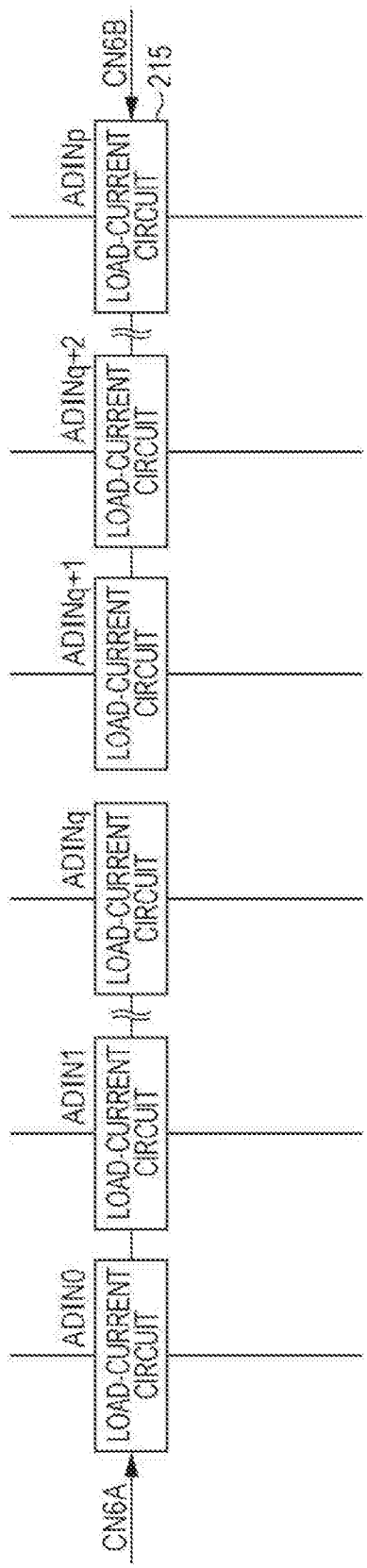
FIG. 21 is a schematic diagram illustrating an example of supply of control signals to the load-current circuits in the first modification of the second embodiment.

Two control circuits 205B and 220B, which are arranged to the left and right of the column processing section 206, may generate the control signals CN6A and CN6B. FIG. 20 is a block diagram illustrating an example configuration of an imaging device 200B according to a first modification of the second embodiment. The imaging device 200B illustrated in FIG. 20 differs from the imaging device 200A illustrated in FIG. 17 in that the control circuits 205B and 220B are provided instead of the control circuit 205A. FIG. 21 is a diagram illustrating an example of supply of the control signals CN6A and CN6B to the load-current circuits 215 in this modification.

The control circuit 205B generates the control signal CN6A. The control circuit 205B is arranged adjacent to a left-end portion of the region in which the load-current circuits 215 are arranged. In other words, the control circuit 205B is arranged adjacent to an end portion of the region in which, of the load-current circuits 215, the load-current circuits 215 that correspond to the digital signals ADIN0 to ADINq and to which the control signal CN6A is supplied are arranged.

The control circuit 220B generates the control signal CN6B. The control circuit 220B is arranged adjacent to a right-end portion of the region in which the load-current circuits 215 are arranged. In other words, the control circuit 220B is arranged adjacent to an end portion of the region in which, of the plurality of load-current circuits 215, the load-current circuits 215 that correspond to the digital signals ADINq+1 to ADINp and to which the control signal CN6B is supplied are arranged.

With the above-described configuration, in the imaging device 200B, the control signals CN6A and CN6B can be supplied from both sides of the column processing section 206. Thus, since two wiring stages do not need to be provided to transmit the control signals CN6A and CN6B, it is possible to reduce the area. In addition, since the length of wires can be reduced, it is possible to reduce variations in the control signals CN6A and CN6B.

Second Modification of Second Embodiment

Figure 22:
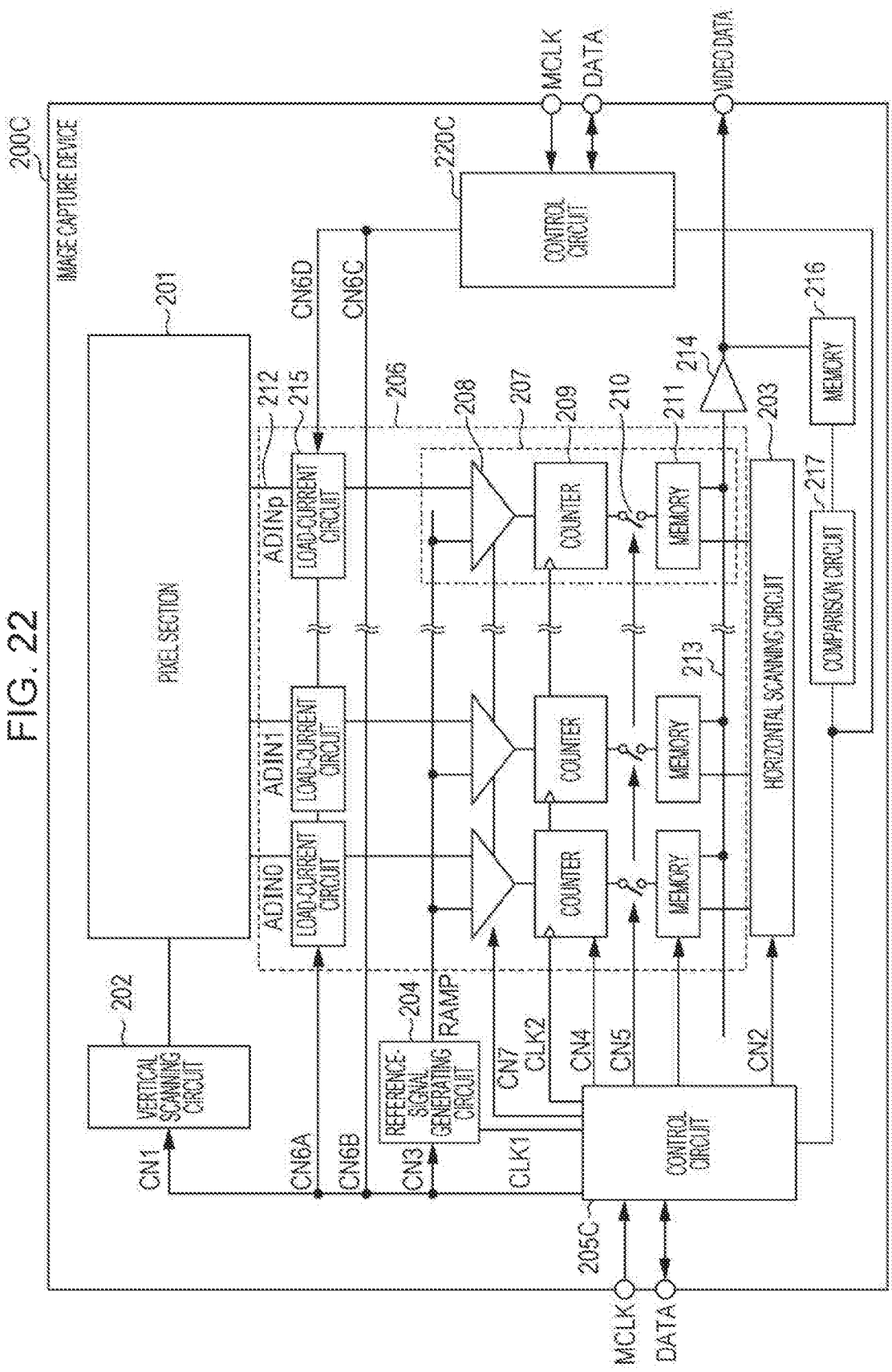
FIG. 22 is a block diagram illustrating an exemplary circuit configuration of an imaging device in a second modification of the second embodiment.
Figure 23:
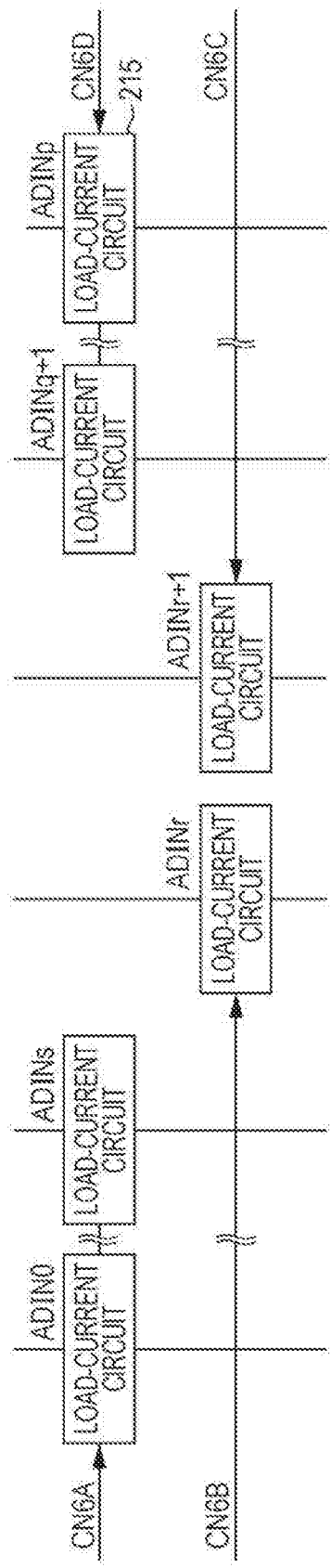
FIG. 23 is a schematic diagram illustrating an example of supply of control signals to the load-current circuits in the second modification of the second embodiment.

Although an example in which control on the two divided groups is performed has been described above, control on three or more divided groups may be performed. FIG. 22 is a block diagram illustrating an example configuration of an imaging device 200C when control is performed on four divided groups. The functions of control circuits 205C and 220C in the imaging device 200C illustrated in FIG. 22 differ from those of the control circuits 205B and 220B in the imaging device 200B illustrated in FIG. 20. FIG. 23 illustrates an example of supply of the control signals CN6A, CN6B, CN6C, and CN6D to the load-current circuits 215 in a second modification of the second embodiment.

The control circuit 205C generates the control signals CN6A and CN6B. The control circuit 220C generates the control signals CN6C and CN6D.

The control circuit 205C individually controls the control signals CN6A and CN6B. The control circuit 220C individually controls the control signals CN6C and CN6D. The control signals CN6A, CN6B, CN6C, and CN6D are supplied to the corresponding load-current circuits 215 in the different columns.

Specifically, the control signal CN6A is supplied to the load-current circuits 215 corresponding to the digital signals ADIN0 to ADINs. The control signal CN6B is supplied to the load-current circuits 215 corresponding to the pixel signals ADINs+1 to ADINr. The control signal CN6C is supplied to the load-current circuits 215 corresponding to the digital signals ADINr+1 to ADINq. The control signal CN6D is supplied to the load-current circuits 215 corresponding to the digital signals ADINq+1 and ADINp. In this case, p, q, r, and s are integers greater than or equal to 1 and have a magnitude correlation given by p>q>r>s.

By using a scheme that is analogous to that in the first embodiment, the control circuit 205C generates the control signal CN6A in accordance with a result of comparison of the digital signals ADIN0 to ADINs with a threshold. In accordance with a result of comparison of the digital signals ADINs+1 to ADINr with the threshold, the control circuit 205C generates the control signal CN6B.

In accordance with a result of comparison of the digital signals ADINr+1 to ADINq with the threshold, the control circuit 220C generates the control signal CN6C. In accordance with a result of comparison of the digital signals ADINq+1 to ADINp with the threshold, the control circuit 220C generates the control signal CN6D.

With the above-described configuration, in the imaging device 200C in this modification, the load-current circuits 215 can be divided into four groups and be individually controlled using the four types of control signal CN6A, CN6B, CN6C, and CN6D. This enables fine control on the load currents, thus making it possible to further reduce the power consumption.

Figure 24:
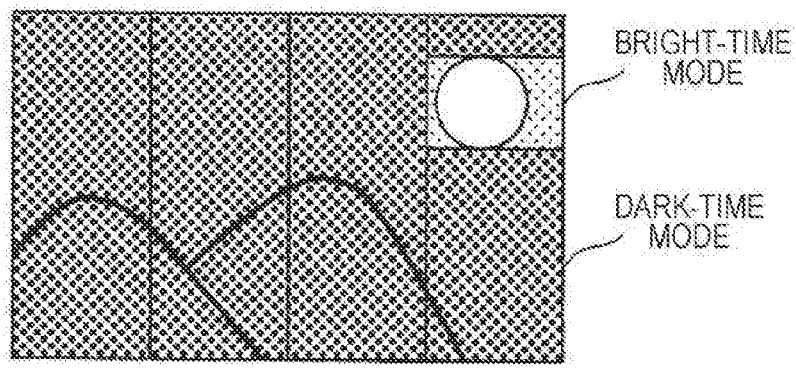
FIG. 24 illustrates an example of regions to which the bright-time mode and the dark-time mode according to the second modification of the second embodiment are applied.

FIG. 24 illustrates regions to which the bright-time mode and the dark-time mode are applied when the imaging device 200C according to the present embodiment captures the image illustrated in FIG. 9A.

In this case, since the size of the full moon corresponds to one-fourth of the total number of rows, and control on the four horizontally divided groups can be performed, the operation mode for $1/16$th of the entire frame is set to the bright-time mode, and the operation mode for $15/16$th of the entire frame is set to the dark-time mode. If the power when the entire frame is in the bright-time mode is 4000 mW, and the power when the entire frame is in the dark-time mode is 3000 mW, the power is given by 4000 mW×(1/16)+3000 mW×(15/16)=3062.5 mW. Since the power that is consumed when the present embodiment is not applied is 4000 mW, it can be understood that the use of the present embodiment can reduce the power by about 23.5%. That is, it can be understood that the power consumption can be further reduced, compared with the example illustrated in FIG. 19.

Third Embodiment

In a third embodiment, a description will be given of a case in which the operation mode is switched using two types of clock signal.

Figure 25:
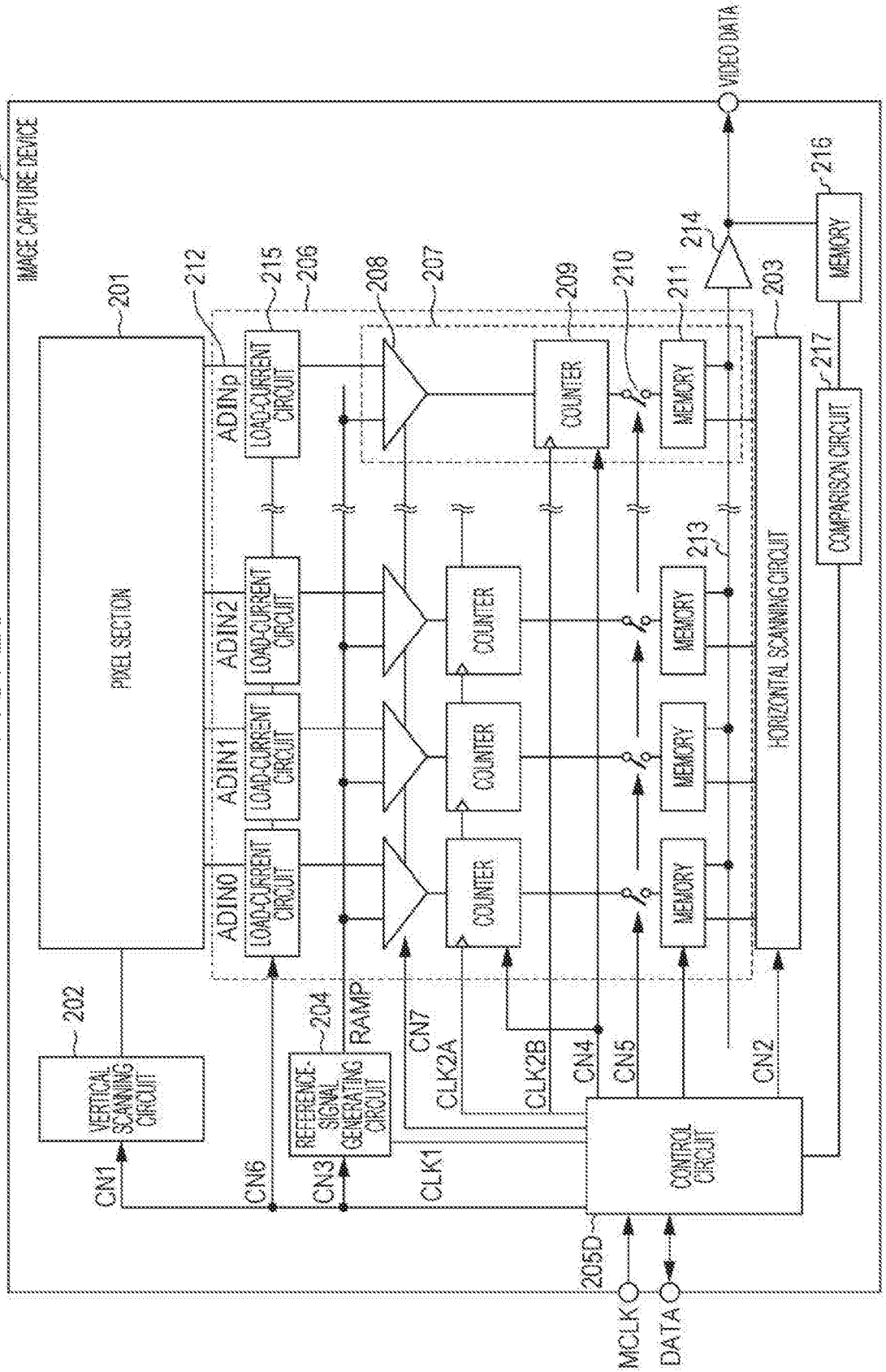
FIG. 25 is a block diagram illustrating an exemplary circuit configuration of an imaging device in a third embodiment.

FIG. 25 is a block diagram illustrating an example configuration of an imaging device 200D according to the third embodiment. The functions of a control circuit 205D in the imaging device 200D illustrated in FIG. 25 differ from the functions of the control circuit 205 in the imaging device 200 illustrated in FIG. 1. Specifically, the control circuit 205D generates clock signals CLK2A and CLK2B instead of the clock signal CLK2.

Figure 26:
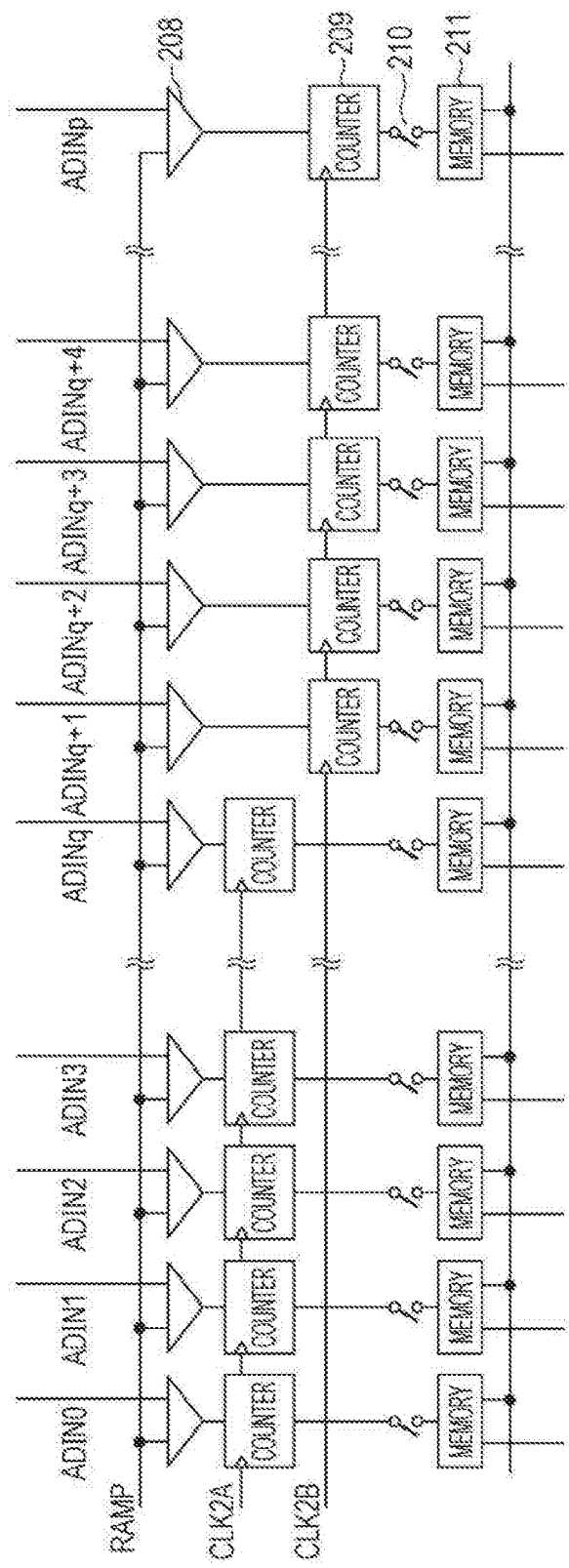
FIG. 26 is a schematic diagram illustrating an example of supply of clock signals to the counters in the third embodiment.

FIG. 26 is a diagram illustrating an example of supply of the clock signals CLK2A and CLK2B to the counters 209 in the present embodiment.

The control circuit 205D individually controls the clock signals CLK2A and CLK2B. The clock signals CLK2A and CLK2B are supplied to the corresponding counters 209 in the different columns. Specifically, the clock signal CLK2A is supplied to the counters 209 corresponding to the digital signals ADIN0 to ADINq. The clock signal CLK2B is supplied to the counters 209 corresponding to the digital signals ADINq+1 to ADINp. In this case, p and q are integers greater than or equal to 1, and p is greater than q.

By using a scheme that is analogous to that in the first embodiment, the control circuit 205D generates the clock signal CLK2A in accordance with a result of comparison of the digital signals ADIN0 to ADINq with a threshold. The control circuit 205D generates the clock signal CLK2B in accordance with a result of comparison of the digital signals ADINq+1 to ADINp with the threshold.

With the above-described configuration, in the imaging device 200D, the counters 209 can be divided into two groups and be individually controlled using the two different types of clock signal CLK2A and CLK2B. This enables fine control on the clock signals, thus making it possible to further reduce the power consumption.

First Modification of Third Embodiment

Figure 27:
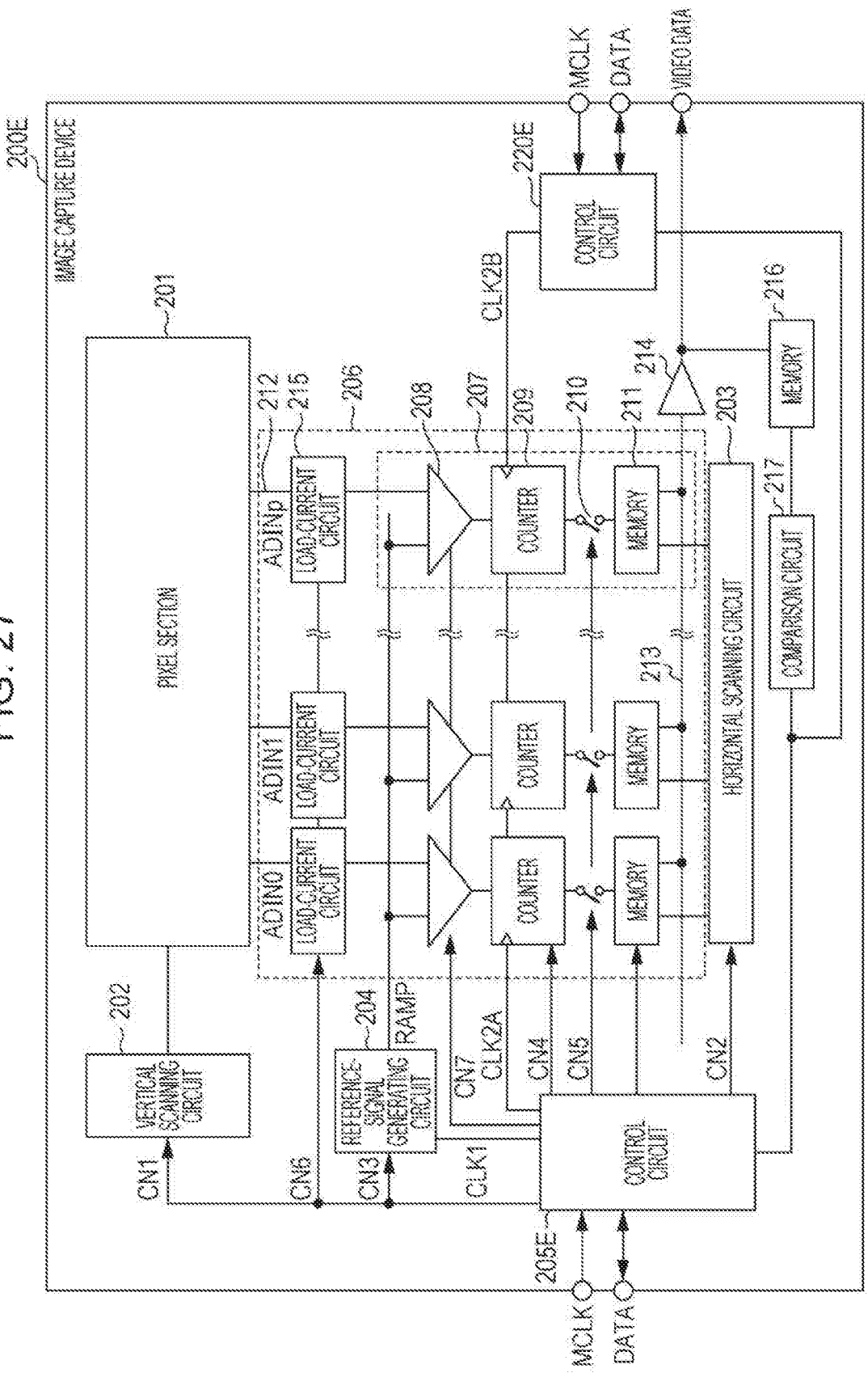
FIG. 27 is a block diagram illustrating an exemplary circuit configuration of an imaging device in a first modification of the third embodiment.
Figure 28:
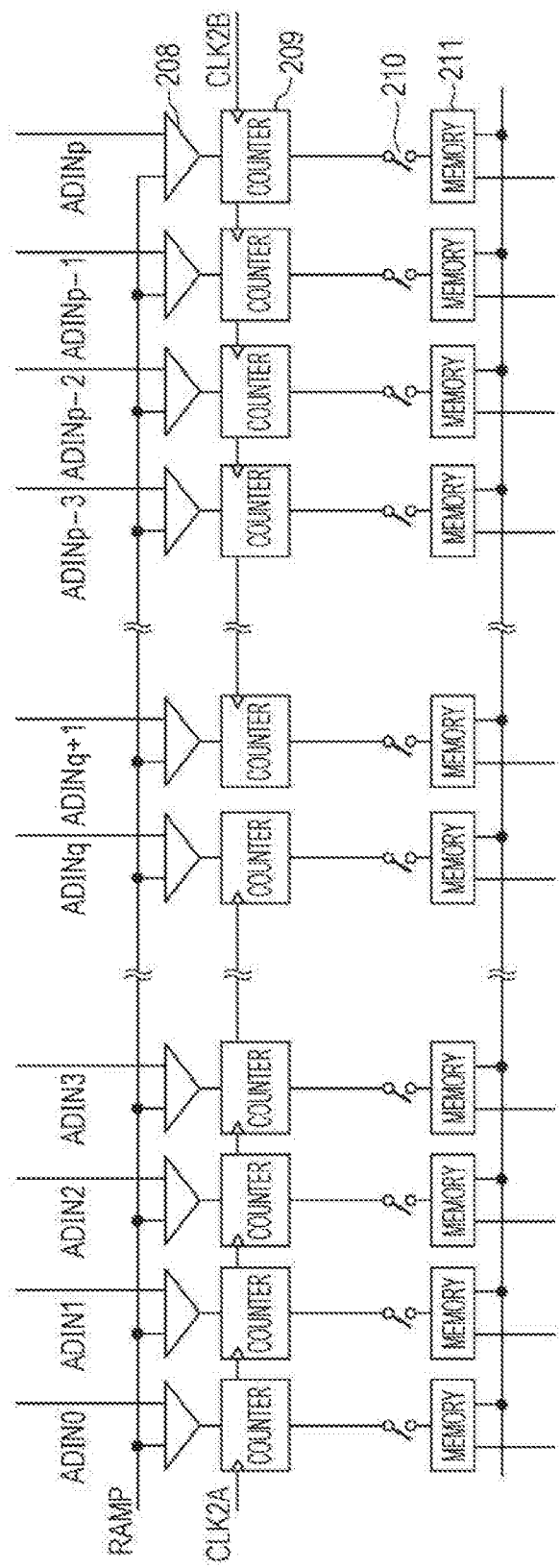
FIG. 28 is a schematic diagram illustrating an example of supply of clock signals to the counters in the first modification of the third embodiment.

Two control circuits 205E and 220E, which are arranged to the left and right of the column processing section 206, may generate the clock signals CLK2A and CLK2B. FIG. 27 is a block diagram illustrating an example configuration of an imaging device 200E according to a first modification of the third embodiment. The imaging device 200E illustrated in FIG. 27 differs from the imaging device 200D illustrated in FIG. 25 in that the control circuits 205E and 220E are provided instead of the control circuit 205D. FIG. 28 is a diagram illustrating an example of supply of the clock signals CLK2A and CLK2B to the counters 209 in this modification.

The control circuit 205E generates the clock signal CLK2A. The control circuit 205E is arranged adjacent to a left-end portion of the region in which the counters 209 are arranged. In other words, the control circuit 205E is arranged adjacent to an end portion of the region in which, of the plurality of counters 209, the counters 209 that correspond to the digital signals ADIN0 to ADINq and to which the clock signal CLK2A is supplied are arranged.

The control circuit 220E generates the clock signal CLK2B. The control circuit 220E is arranged adjacent to a right-end portion of the region in which the counters 209 are arranged. In other words, the control circuit 220E is arranged adjacent to an end portion of the region in which, of the plurality of counters 209, the counters 209 that correspond to the digital signals ADINq+1 to ADINp and to which the clock signal CLK2B is supplied are arranged.

With the above-described configuration, in the imaging device 200E, the clock signals CLK2A and CLK2B can be supplied from both sides of the column processing section 206. Thus, since two wiring stages do not need to be provided to transmit the clock signals CLK2A and CLK2B, it is possible to reduce the area. In addition, since the length of wires can be reduced, it is possible to reduce variations in the clock signals CLK2A and CLK2B.

Second Modification of Third Embodiment

Figure 29:
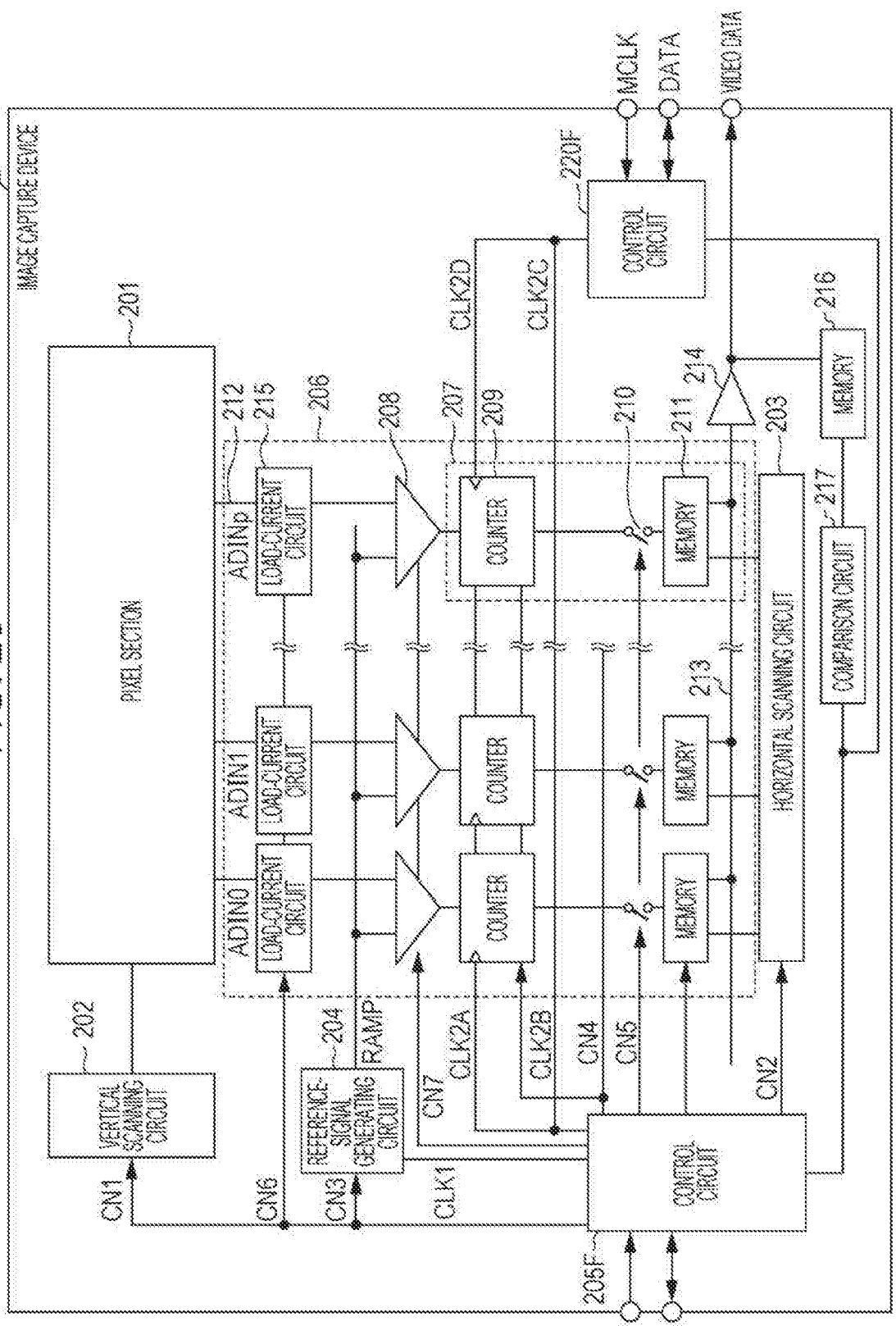
FIG. 29 is a block diagram illustrating an exemplary circuit configuration of an imaging device in a second modification of the third embodiment.
Figure 30:
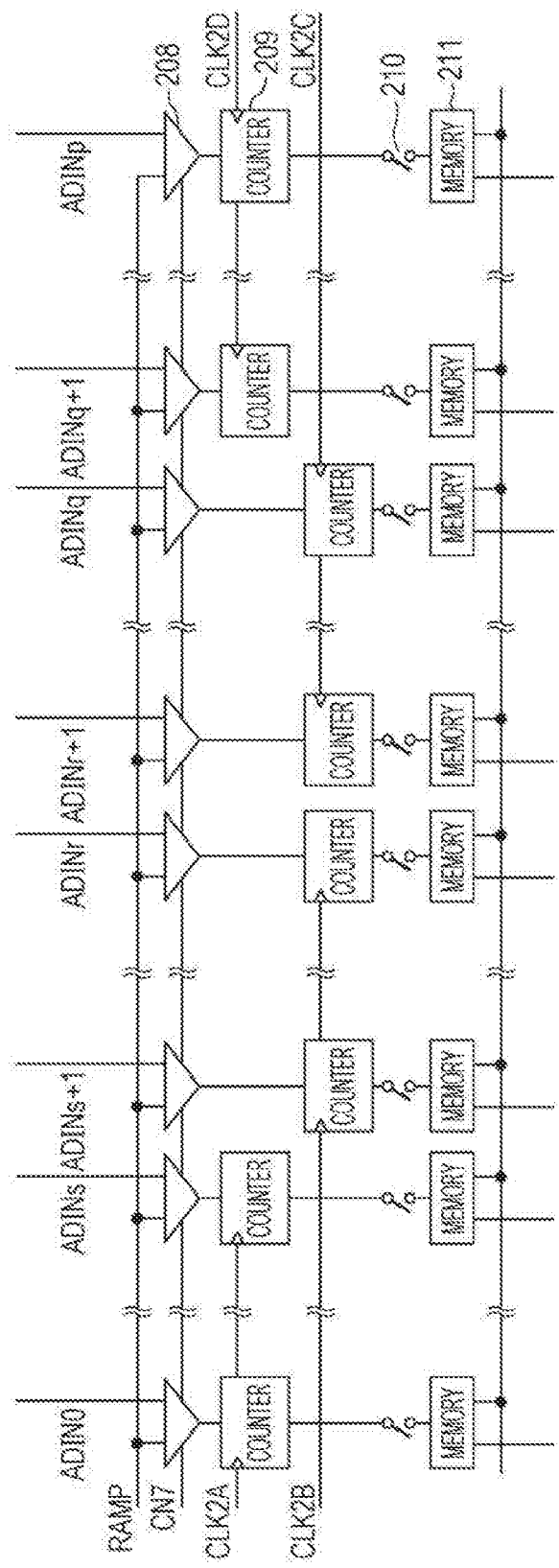
FIG. 30 is a schematic diagram illustrating an example of supply of clock signals to the counters in the second modification of the third embodiment.

Although an example in which control on the two divided groups is performed has been described above, control on three or more divided groups may be performed. FIG. 29 is a block diagram illustrating an example configuration of an imaging device 200F when control on four divided groups is performed. The functions of control circuits 205F and 220F in the imaging device 200F illustrated in FIG. 29 differ from the functions of the control circuits 205E and 220E in the imaging device 200E illustrated in FIG. 27. FIG. 30 is a diagram illustrating an example of supply of clock signals CLK2A, CLK2B, CLK2C, and CLK2D to the counters 209 in this modification.

The control circuit 205F generates the clock signals CLK2A and CLK2B. The control circuit 220F generates the clock signals CLK2C and CLK2D.

The control circuit 205F individually controls the clock signals CLK2A and CLK2B. The control circuit 220F individually controls the clock signals CLK2C and CLK2D. The clock signals CLK2A, CLK2B, CLK2C, and CLK2D are supplied to the corresponding counters 209 in the different columns.

Specifically, the clock signal CLK2A is supplied to the counters 209 corresponding to the digital signals ADIN0 to ADINs. The clock signal CLK2B is supplied to the counters 209 corresponding to the digital signals ADINs+1 to ADINr. The clock signal CLK2C is supplied to the counters 209 corresponding to the digital signals ADINr+1 to ADINq. The clock signal CLK2D is supplied to the counters 209 corresponding to the digital signals ADINq+1 to ADINp. In this case, p, q, r, and s are integers greater than or equal to 1 and have a magnitude correlation given by p>q>r>s.

By using a scheme that is analogous to that in the first embodiment, the control circuit 205F generates the clock signal CLK2A in accordance with a result of comparison of the digital signals ADIN0 to ADINs with a threshold. The control circuit 205F generates the clock signal CLK2B in accordance with a result of comparison of the digital signals ADINs+1 to ADINr with the threshold.

The control circuit 220F generates the clock signal CLK2C in accordance with a result of comparison of the digital signals ADINr+1 to ADINq with the threshold. The control circuit 220F generates the clock signal CLK2D in accordance with a result of comparison of the digital signals ADINq+1 to ADINp with the threshold.

With the above-described configuration, in the imaging device 200F according to this modification, the counters 209 can be divided into four groups and be individually controlled using the four types of clock signal CLK2A, CLK2B, CLK2C, and CLK2D. This enables fine control on the load currents, thus making it possible to further reduce the power consumption.

Fourth Embodiment

In a fourth embodiment, a description will be given of a case in which the operation mode is switched using two types of control signal for controlling the comparators 208.

Figure 31:
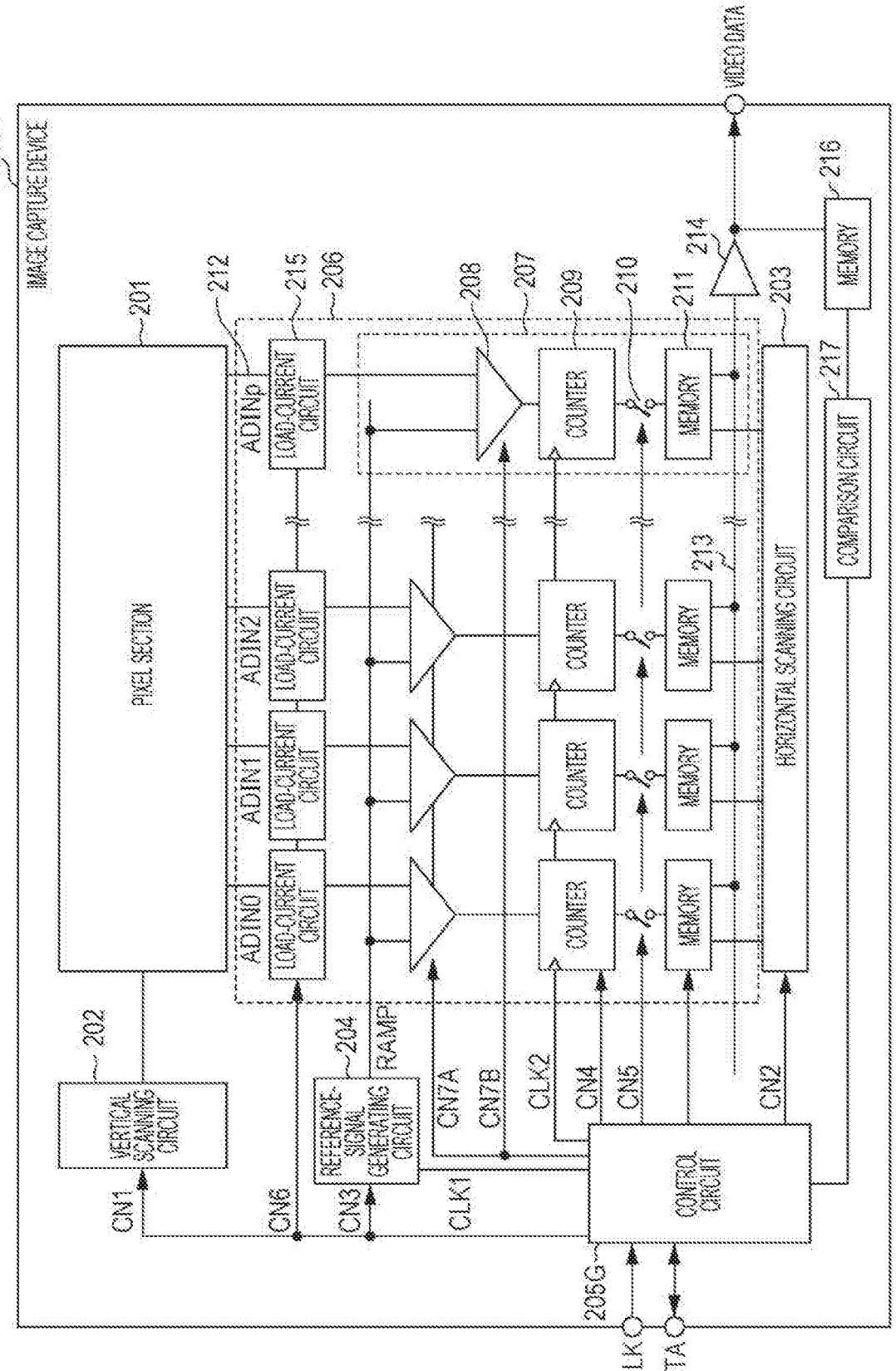
FIG. 31 is a block diagram illustrating an exemplary circuit configuration of an imaging device in a fourth embodiment.

FIG. 31 is a block diagram illustrating an example configuration of an imaging device 200G according to the present embodiment. The functions of a control circuit 205G in the imaging device 200G illustrated in FIG. 31 differ from the functions of the control circuit 205 in the imaging device 200 illustrated in FIG. 1. Specifically, the control circuit 205G generates control signals CN7A and CN7B instead of the control signal CN7.

Figure 32:
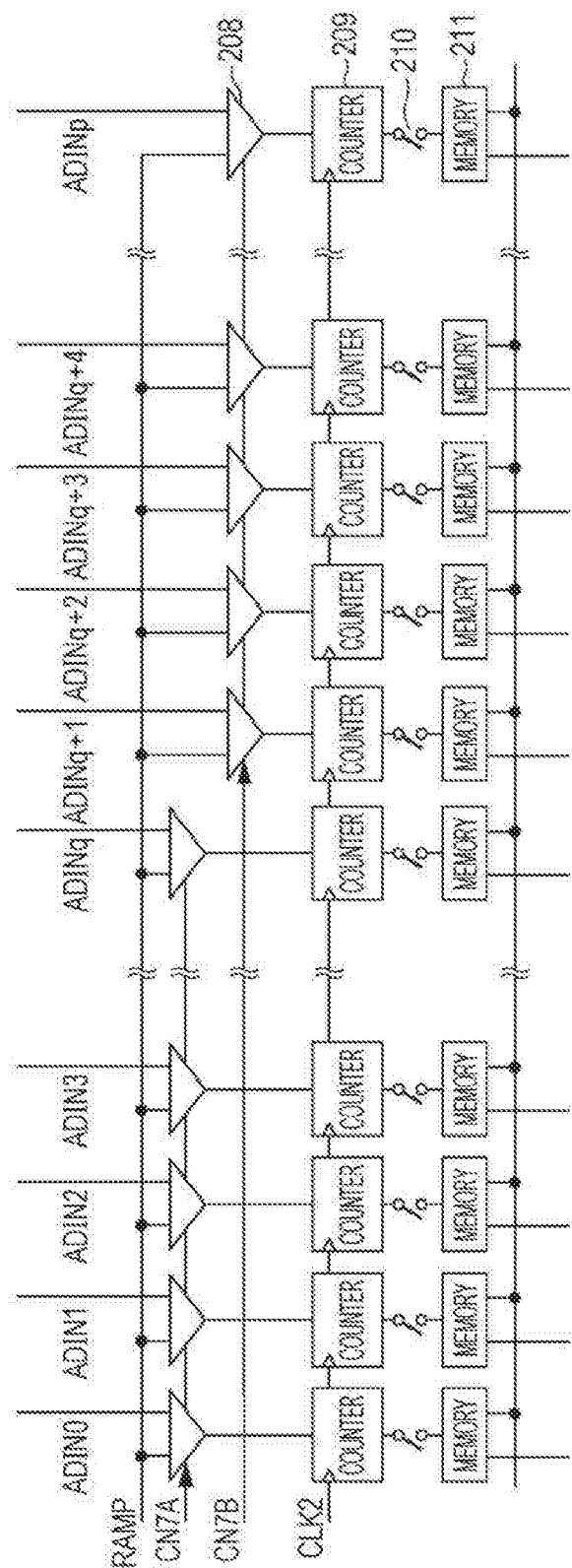
FIG. 32 is a schematic diagram illustrating an example of supply of control signals to comparators in the fourth embodiment.

FIG. 32 is a diagram illustrating an example of supply of the control signals CN7A and CN7B to the comparators 208 in the present embodiment.

The control circuit 205G individually controls the control signals CN7A and CN7B. The control signals CN7A and CN7B are supplied to the corresponding comparators 208 in the different columns. Specifically, the control signal CN7A is supplied to the comparators 208 corresponding to the digital signals ADIN0 to ADINq. The control signal CN7B is supplied to the comparators 208 corresponding to the digital signals ADINq+1 to ADINp. In this case, p and q are integers greater than or equal to 1, and p is greater than q.

By using a scheme that is analogous to that in the first embodiment, the control circuit 205G generates the control signal CN7A in accordance with a result of comparison of the digital signals ADIN0 to ADINq with a threshold. The control circuit 205G generates the control signal CN7B in accordance with a result of comparison of the digital signals ADINq+1 to ADINp with the threshold.

With the above-described configuration, in the imaging device 200G, the comparators 208 can be divided into two groups and be individually controlled using the two different types of control signal CN7A and CN7B. This enables fine control on the control signals, thus making it possible to reduce the power consumption.

First Modification of Fourth Embodiment

Figure 33:
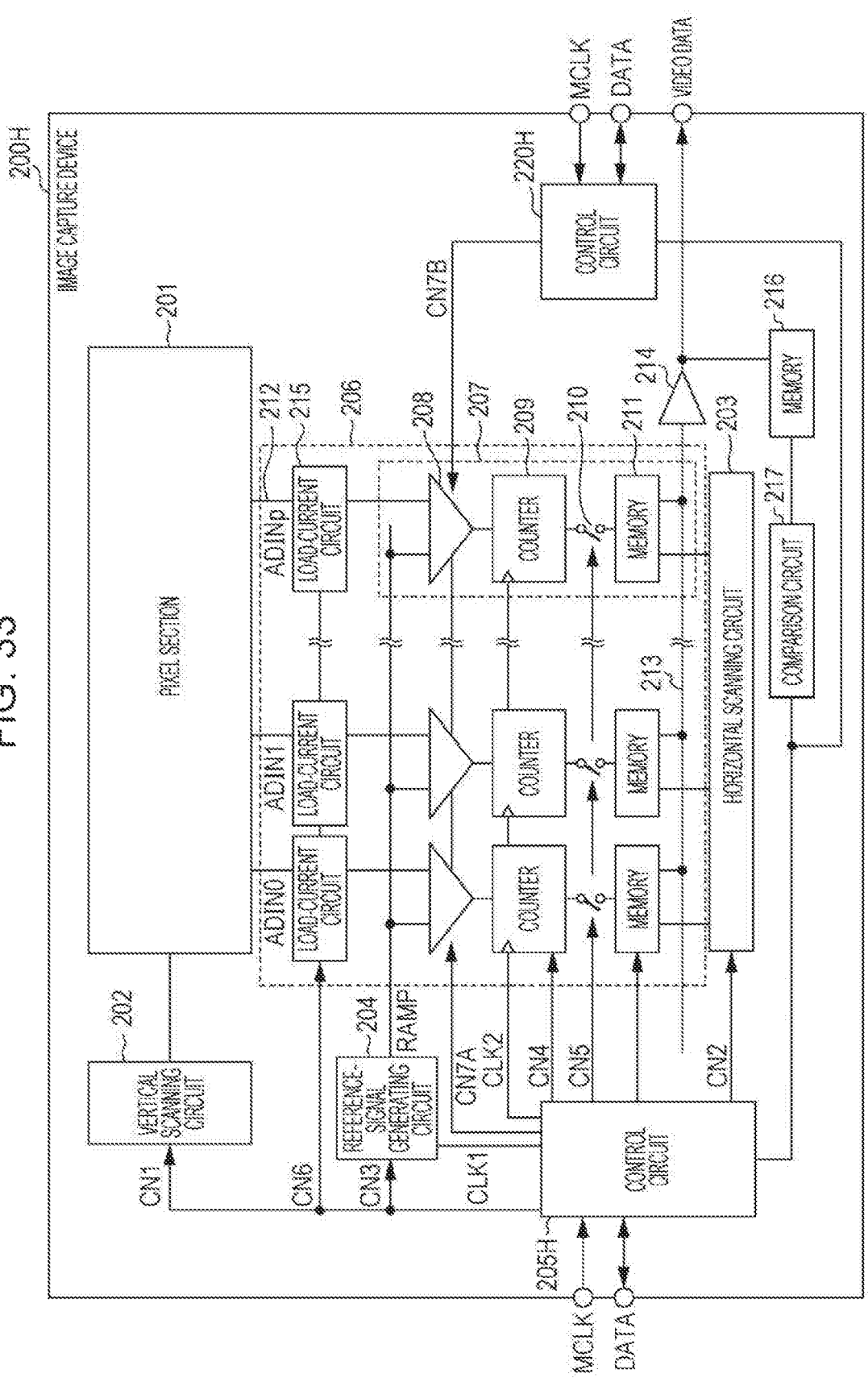
FIG. 33 is a block diagram illustrating an exemplary circuit configuration of an imaging device in a first modification of the fourth embodiment.
Figure 34:
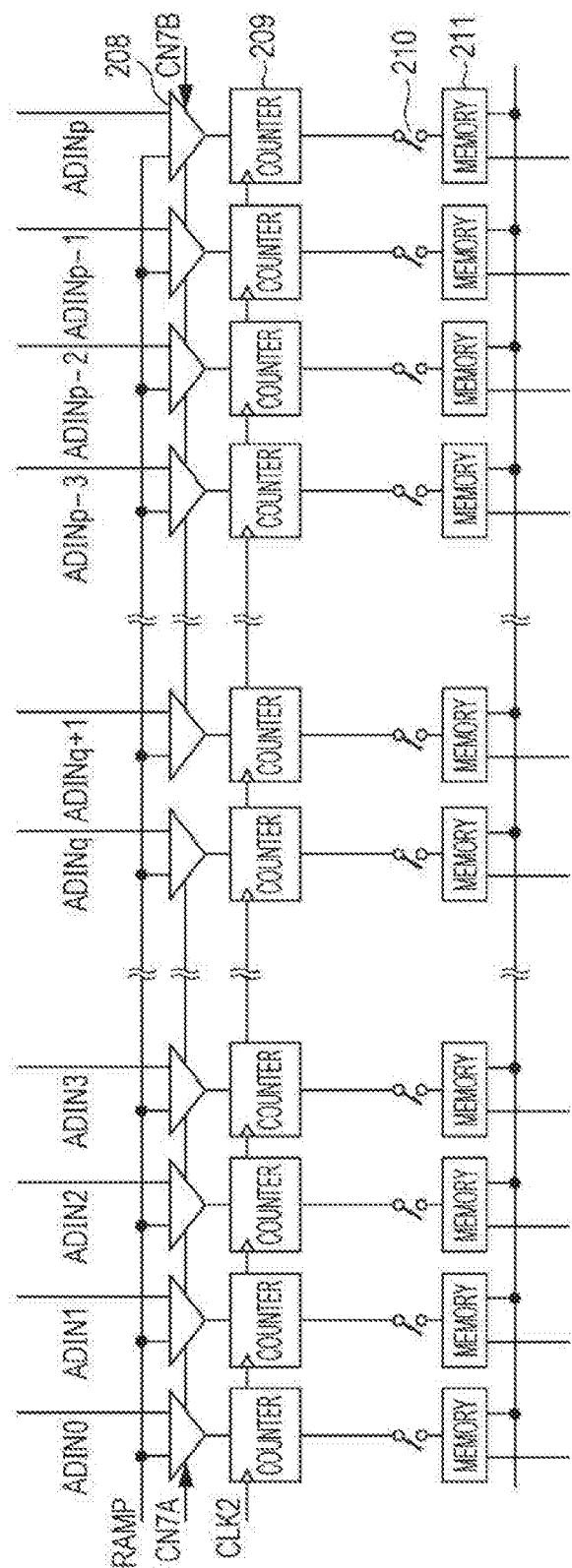
FIG. 34 is a schematic diagram illustrating an example of supply of control signals to the comparators in the first modification of the fourth embodiment.

Two control circuits 205H and 220H, which are arranged to the left and right of the column processing section 206, may generate the control signals CN7A and CN7B. FIG. 33 is a block diagram illustrating an example configuration of an imaging device 200H according to a first modification of the fourth embodiment. The imaging device 200H illustrated in FIG. 33 differs from the imaging device 200G illustrated in FIG. 31 in that the control circuits 205H and 220H are provided instead of the control circuit 205G. FIG. 34 is a diagram illustrating an example of supply of the control signals CN7A and CN7B to the comparators 208 in this modification.

The control circuit 205H generates the control signal CN7A. The control circuit 205H is arranged adjacent to a left-end portion of the region in which the comparators 208 are arranged. In other words, the control circuit 205H is arranged adjacent to an end portion of the region in which, of the plurality of comparators 208, the comparators 208 that correspond to the digital signals ADIN0 to ADINq and to which the control signal CN7A is supplied are arranged.

The control circuit 220H generates the control signal CN7B. The control circuit 220H is arranged adjacent to a right-end portion of the region in which the comparators 208 are arranged. In other words, the control circuit 220H is arranged adjacent to an end portion of the region in which, of the plurality of comparators 208, the comparators 208 that correspond to the digital signals ADINq+1 to ADINp and to which the control signal CN7B is supplied are arranged.

With the above-described configuration, in the imaging device 200H, the control signals CN7 and CN7B can be supplied from both sides of the column processing section 206. Thus, since two wiring stages do not need to be provided to transmit the control signals CN7 and CN7B, it is possible to reduce the area. In addition, since the length of wires can be reduced, it is possible to reduce variations in the control signals CN7 and CN7B.

Second Modification of Fourth Embodiment

Figure 35:
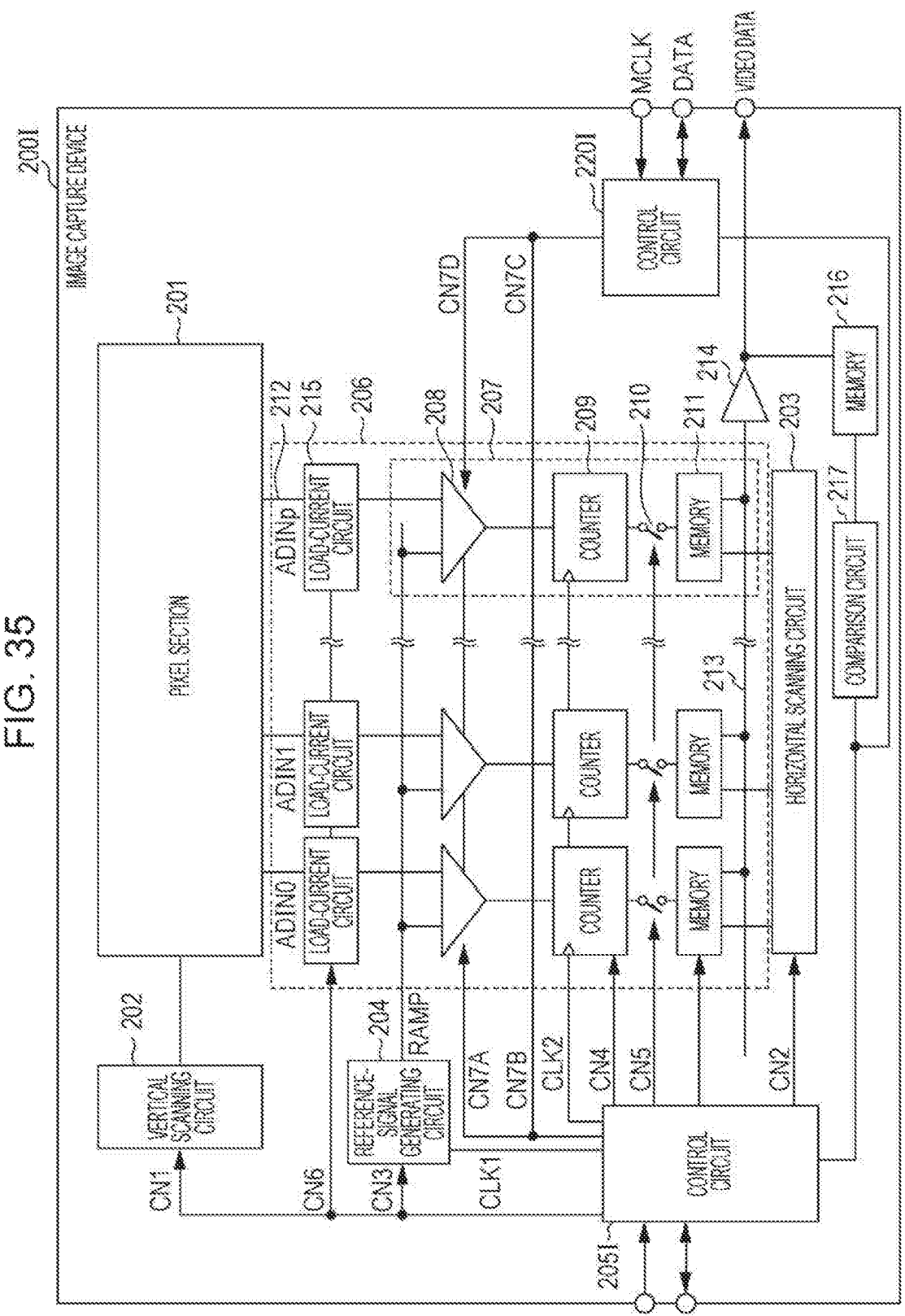
FIG. 35 is a block diagram illustrating an exemplary circuit configuration of an imaging device in a second modification of the fourth embodiment.
Figure 36:
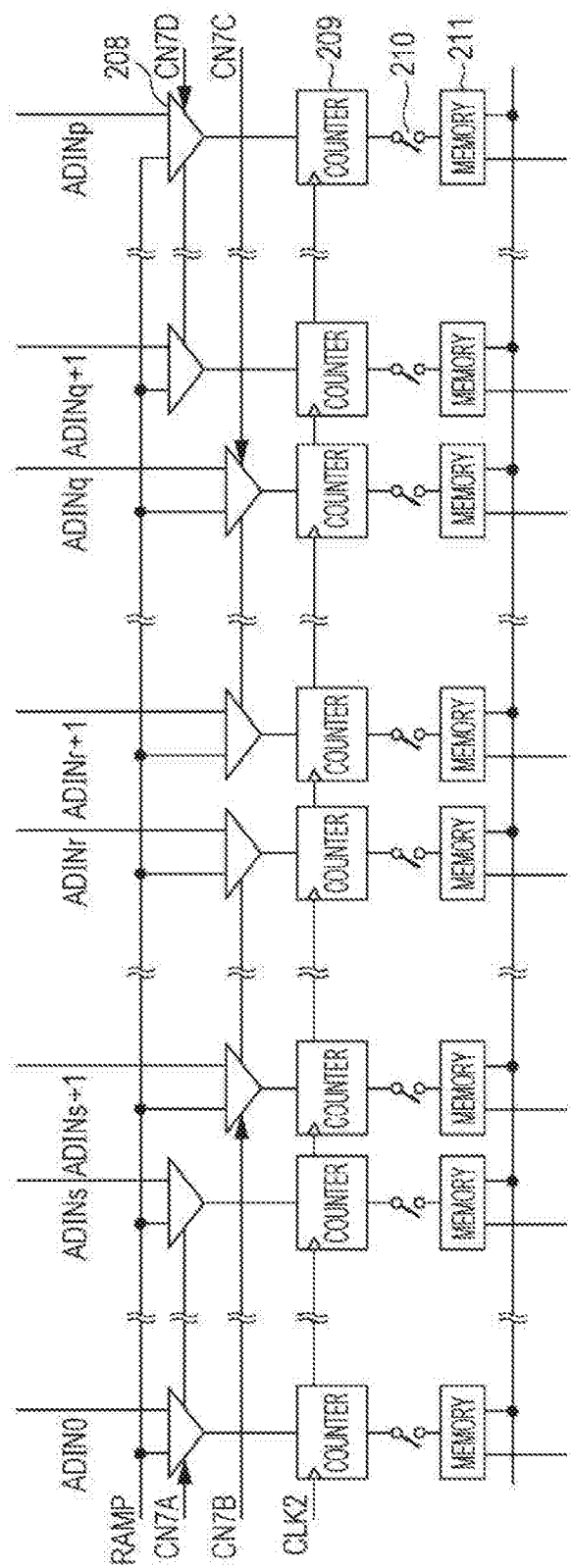
FIG. 36 is a schematic diagram illustrating an example of supply of control signals to comparators in the second modification of the fourth embodiment.

Although an example in which control on the two divided groups is performed has been described above, control on three or more divided groups may be performed. FIG. 35 is a block diagram illustrating an example configuration of an imaging device 200I when control on four divided groups is performed. The functions of control circuits 205I and 220I in the imaging device 200I illustrated in FIG. 35 differ from the functions of the control circuits 205H and 220H in the imaging device 200H illustrated in FIG. 33. FIG. 36 is a diagram illustrating an example of supply of the control signals CN7A, CN7B, CN7C, and CN7D to the comparators 208 in a second modification of the fourth embodiment.

The control circuit 205I generates the control signals CN7A and CN7B. The control circuit 220I generates the control signals CN7C and CN7D.

The control circuit 205I individually controls the control signals CN7A and CN7B. The control circuit 220I individually controls the control signals CN7C and CN7D. The control signals CN7A, CN7B, CN7C, and CN7D are supplied to the corresponding comparators 208 in the different columns.

Specifically, the control signal CN7A is supplied to the comparators 208 corresponding to the digital signals ADIN0 to ADINs. The control signal CN7B is supplied to the comparators 208 corresponding to the digital signals ADINs+1 to ADINr. The control signal CN7C is supplied to the comparators 208 corresponding to the digital signals ADINr+1 to ADINq. The control signal CN7D is supplied to the comparators 208 corresponding to the digital signals ADINq+1 to ADINp. in this case, p, q, r, and s are integers greater than or equal to 1 and have a magnitude correlation given by p>q>r>s.

By using a scheme that is analogous to that in the first embodiment, the control circuit 205I generates the control signal CN7A in accordance with a result of comparison of the digital signals ADIN0 to ADINs with a threshold. The control circuit 205I generates the control signal CN7B in accordance with a result of comparison of the digital signals ADINs+1 to ADINr with the threshold.

The control circuit 220I generates the control signal CN7C in accordance with a result of comparison of the digital signals ADINr+1 to ADINq with the threshold. The control circuit 220I generates the control signal CN7D in accordance with a result of comparison of the digital signals ADINq+1 to ADINp with the threshold.

With the above-described configuration, in the imaging device 200I in this modification, the comparators 208 can be divided into four groups and be individually controlled using the four types of control signal CN7A, CN7B, CN7C, and CN7D. This enables fine control on the load currents, thus making it possible to further reduce the power consumption.

Although examples in which control is independently performed on the load currents, the clock signals CLK2, and the operation currents for the comparators 208 have been individually described above in the second to fourth embodiments, some of the embodiments may be combined.

Fifth Embodiment

In a fifth embodiment, a description will be given of a camera system using one of the imaging devices according to the embodiments described above. FIG. 37 is a block diagram illustrating an example configuration of a camera system 100 according to the present embodiment. The camera system 100 is applied to, for example, a smartphone, a video camera, a digital still camera, a surveillance camera, or a vehicle-mounted camera.

The camera system 100 includes an imaging device 200J, a lens 101, a camera-signal processing circuit 103, and a system controller 104.

The imaging device 200J is, for example, one of the imaging devices 200 to 200I according to the embodiments described above.

The lens 101 is an optical element for introducing incident light to the pixel section 201 included in the imaging device 200J. The imaging device 200J converts light of an image, formed on an image capture plane by the lens 101, into electrical signals for respective pixels and outputs resulting image signals.

The camera-signal processing circuit 103 is a circuit for performing various types of processing on the image signals generated by the imaging device 200J.

The system controller 104 is a controller for driving the imaging device 200J and the camera-signal processing circuit 103.

The image signals processed by the camera-signal processing circuit 103 are recorded to, for example, a storage medium, such as a memory, as a still image or a moving image. Alternatively, the image signals are shown on a monitor, such as a liquid-crystal display, in the form of a moving image.

The camera system 100 according to the present embodiment can reduce the power consumption through use of the above-described imaging device 200J.

Other Modifications, Etc.

The imaging devices according to the present disclosure are not limited to the above-described embodiments. Other embodiments implemented by combining arbitrary constituent elements in the individual embodiments, modifications obtained by making various changes conceived by those skilled in the art to each embodiment within a scope not departing from the spirit of the present disclosure, and a variety of appliances incorporating any of the imaging devices according to the present disclosure are also encompassed by the present disclosure.

For example, although each of the above-described embodiments has a configuration in which the clock signal CLK2 for the counters 209 provided for the respective columns are supplied thereto, and counting operations for the respective columns are stopped at the inversion timings of the output signals of the comparators 208 to thereby realize digitization, the present disclosure is not limited thereto. For example, a common counter may be provided outside the array of columns, each of which may be provided with a memory or a latch for A/D conversion. The common counter distributes a count value to all the columns. Digitization may be performed by latching count values for the respective columns at inversion timings in the comparators.

Also, the configuration of the pixels included in the pixel section 201 may be a configuration for performing pixel selection by a potential of a floating diffusion without use of selection transistors. The configuration of the pixels may be realized by a unit cell in which a plurality of pixels shares a reset transistor and a source follower transistor.

Also, although, in each embodiment described above, the description has been given of a type in which a ramp signal for single-slope-type column-parallel A/D conversion is referred to, a column A/D conversion (e.g., a sequential-comparison-type A/D conversion) in which a reference voltage is supplied to all columns may be used, which also offers similar advantages.

The division of the functional blocks in each block diagram is one example. Thus, some of the functional blocks may be realized as one functional block, one of the functional blocks may be divided into a plurality of blocks, or one or more functions may be moved to another functional block.

The order in which the individual steps illustrated in each flowchart are executed is exemplary and illustrative for specifically describing the present disclosure and may be an order other than the above-described order. Also, some of the above-described steps may be executed concurrently (in parallel) with the other step(s).

Some or all of the processing units included in each of the devices according to the embodiments are typically implemented as a large-scale integrated (LSI) circuit. The processing units may be individually realized by single chips or some or all of the functional blocks may be realized by a single chip.

The circuit integration is not limited to LSI and may be realized by a dedicated circuit or a general-purpose processor. The present disclosure may also utilize a field programmable gate array (FPGA) that can be programmed after manufacture of an LSI or a reconfigurable processor that allows reconfiguration of connections and settings of circuit cells inside an LSI.

In each embodiment described above, some of the constituent elements may be implemented by executing a software program suitable for the constituent elements. A program executor, such as a central processing unit (CPU) or a processor, may read and execute a software program recorded on/in a storage medium, such as a hard disk or a semiconductor memory, to thereby realize the constituent elements.

The present disclosure can reduce power consumption even in a high-speed operation and in a wide dynamic range and is appliance to, for example, smartphones, sensor systems, and various camera systems, such as digital still cameras, surveillance cameras, on-board cameras, digital single-lens reflex cameras, and digital mirrorless single-lens reflex cameras.

What is claimed is:

1. An imaging device comprising:
   pixels arranged in m rows by n columns, where each of m and n is an integer greater than or equal to 2, each of the pixels generating a pixel signal in accordance with incident light;
   a first signal line, through which a first pixel signal outputted from each of pixels in an $a^{th}$ column among the pixels is transmitted, where a is an integer of 1 to n;
   a first load-current circuit that supplies a first load current to the first signal line;
   a first control circuit;
   a first conversion circuit that converts the first pixel signal into a first digital signal; and
   a comparison circuit that compares the first digital signal with a threshold, wherein
   the first conversion circuit includes
      a first comparator that compares the first pixel signal with a reference signal, to generate a first output signal indicating a result of comparison, and
      a first counter that counts a period from start of a first counting period to inversion of the first output signal by using a first clock signal, to generate the first digital signal, and
   in accordance with a magnitude correlation between the first digital signal obtained from a first pixel located at the $a^{th}$ column and a $b^{th}$ row and the threshold, the first control circuit determines a period in which the first clock signal is supplied to the first counter in the first counting period of a second pixel located at the $a^{th}$ column and a $c^{th}$ row different from the $b^{th}$ row, where each of b and c is an integer of 1 to m.

2. The imaging device according to claim 1, further comprising:
   a second signal line, through which a second pixel signal outputted from each of the pixels in a $d^{th}$ column different from the $a^{th}$ column among the pixels is transmitted, where d is an integer of 1 to n;
   a second load-current circuit that supplies a second load current to the second signal line; and
   a second conversion circuit that converts the second pixel signal into a second digital signal, wherein
   the comparison circuit compares the second digital signal with the threshold;
   the second conversion circuit includes
      a second comparator that compares the second pixel signal with the reference signal, to generate a second output signal indicating a result of comparison, and
      a second counter that counts a period from start of a second counting period to inversion of the second output signal by using a second clock signal, to generate the second digital signal; and
   in accordance with a magnitude correlation between the second digital signal obtained from a third pixel located at the $d^{th}$ column and an $e^{th}$ row and the threshold, the first control circuit determines a period that is included in the second counting period of a fourth pixel located at the $d^{th}$ column and an $f^{th}$ row different from the $e^{th}$ row and in which the second clock signal is supplied to the second counter, where each of e and f is an integer of 1 to m.

3. The imaging device according to claim 1, further comprising:
   a second signal line, through which a second pixel signal outputted from each of the pixels in a $d^{th}$ column different from the $a^{th}$ column among the pixels, where d is an integer of 1 to n;
   a second load-current circuit that supplies a second load current to the second signal line;
   a second control circuit; and
   a second conversion circuit that converts the second pixel signal into a second digital signal, wherein
   the comparison circuit compares the second digital signal with the threshold;
   the second conversion circuit includes
      a second comparator that compares the second pixel signal with the reference signal, to generate a second output signal indicating a result of comparison, and
      a second counter that counts a period from start of a second counting period to inversion of the second output signal by using a second clock signal, to generate the second digital signal;
   in accordance with a magnitude correlation between the second digital signal obtained from a third pixel located at the $d^{th}$ column and an $e^{th}$ row and the threshold, the second control circuit determines a period that is included in the second counting period of a fourth pixel located at the $d^{th}$ column and an $f^{th}$ row different from the $e^{th}$ row and in which the second clock signal is supplied to the second counter, where each of e and f is an integer of 1 to m;

the first control circuit is located outside a region in which the first counter and the second counter are located, the first control circuit being closer to a region in which the first counter is located; and the second control circuit is located outside the region in which the first counter and the second counter are located, the second control circuit being closer to a region in which the second counter is located.

4. The imaging device according to claim 1, wherein the threshold comprises a first threshold and a second threshold greater than the first threshold; and in accordance with a magnitude correlation between the first digital signal obtained from the first pixel and the first and second thresholds, the first control circuit determines a period that is included in the first counting period of the second pixel and in which the first clock signal is supplied to the first counter.

5. The imaging device according to claim 1, wherein, in accordance with the magnitude correlation between the first digital signal obtained from the first pixel and the threshold, the first control circuit determines a current value of the first load current supplied to the first signal line when the first pixel signal of the second pixel is transmitted.

6. The imaging device according to claim 5, wherein the first control circuit determines, as a first current value, the first load current supplied to the first signal line when the first pixel signal of the second pixel is transmitted, in a case where the first digital signal obtained from the first pixel is greater than the threshold, and determines, as a second current value smaller than the first current value, the first load current supplied to the first signal line when the first pixel signal of the second pixel is transmitted, in a case where the first digital signal obtained from the first pixel is smaller than or equal to the threshold.

7. The imaging device according to claim 5, further comprising:

a second signal line, through which a second pixel signal outputted from each of the pixels in a $d^{th}$ column different from the $a^{th}$ column among the pixels is transmitted, where d is an integer of 1 to n;

a second load-current circuit that supplies a second load current to the second signal line; and a second conversion circuit that converts the second pixel signal into a second digital signal, wherein the comparison circuit compares the second digital signal with the threshold; and in accordance with a magnitude correlation between the second digital signal obtained from a third pixel located at the $d^{th}$ column and an $e^{th}$ row and the threshold, the first control circuit determines a current value of the second load current supplied to the second signal line when the second pixel signal of a fourth pixel located at the $d^{th}$ column and an $f^{th}$ row different from the $e^{th}$ row is transmitted, where each of e and f is an integer of 1 to m.

8. The imaging device according to claim 5, further comprising:

a second signal line, through which a second pixel signal outputted from each of the pixels in a $d^{th}$ column different from the $a^{th}$ column among the pixels is transmitted, where d is an integer of 1 to n;

a second load-current circuit that supplies a second load current to the second signal line;

a second control circuit; and a second conversion circuit that converts the second pixel signal into a second digital signal, wherein the comparison circuit compares the second digital signal with the threshold;

in accordance with a magnitude correlation between the second digital signal obtained from a third pixel located at the $d^{th}$ column and an $e^{th}$ row and the threshold, the second control circuit determines the second load current supplied to the second signal line when the second pixel signal of a fourth pixel located at the $d^{th}$ column and an $f^{th}$ row different from the $e^{th}$ row is transmitted, where each of e and f is an integer of 1 to m;

the first control circuit is located outside a region in which the first load-current circuit and the second load-current circuit are located, the first control circuit being closer to a region in which the first load-current circuit is located; and the second control circuit is located outside the region in which the first load-current circuit and the second load-current circuit are located, the second control circuit being closer to a region in which the second load-current circuit is located.

9. The imaging device according to claim 5, wherein the threshold comprises a first threshold and a second threshold greater than the first threshold; and in accordance with a magnitude correlation between the first digital signal obtained from the first pixel and the first and second thresholds, the first control circuit determines the current value of the first load current supplied to the first signal line when the first pixel signal of the second pixel is transmitted.

10. The imaging device according to claim 1, wherein the first counting period is either an up-counting period or a down-counting period.

11. The imaging device according to claim 1, wherein in accordance with a magnitude correlation between the first digital signal obtained from the first pixel and the threshold, the first control circuit determines a first period and a second period in the first counting period of the second pixel, the first clock signal being supplied to the first counter in the first period, the first clock signal being not supplied to the first counter in the second period.

12. The imaging device according to claim 1, wherein the first period includes a time point corresponding to the threshold.

13. The imaging device according to claim 4, wherein in accordance with a magnitude correlation between the first digital signal obtained from the first pixel and the first and second thresholds, the first control circuit determines a first period, a second period and a third period in the first counting period of the second pixel, the first to third periods being continuous in this order, the first clock signal being supplied to the first counter in the second period, the first clock signal being not supplied to the first counter in the first period and the third period.

14. The imaging device according to claim 13, wherein the second period includes a time point corresponding to the first and second thresholds.

15. A camera system, comprising:

the imaging device according to claim 1; and a camera signal processor that processes a signal outputted from the imaging device.

* * * * *